(12) United States Patent
Eadelson

(10) Patent No.: US 12,439,561 B2
(45) Date of Patent: Oct. 7, 2025

(54) SYSTEMS AND METHODS FOR HEAT EXCHANGE

(71) Applicant: ZUTA-CORE LTD., Hof Ashkelon (IL)

(72) Inventor: Nahshon Eadelson, Moshav Sde-Avraham (IL)

(73) Assignee: ZUTA-CORE LTD., Hof Ashkelon (IL)

( * ) Notice: Subject to any disclaimer, the term of this patent is extended or adjusted under 35 U.S.C. 154(b) by 353 days.

(21) Appl. No.: 17/844,134

(22) Filed: Jun. 20, 2022

(65) Prior Publication Data

US 2022/0316764 A1    Oct. 6, 2022

Related U.S. Application Data

(63) Continuation of application No. 16/633,063, filed as application No. PCT/IL2018/050809 on Jul. 21, (Continued)

(51) Int. Cl.
| | | |
|---|---|---|
| H05K 7/20 | (2006.01) | |
| F25B 41/20 | (2021.01) | |
| F25B 41/24 | (2021.01) | |
| F25B 41/31 | (2021.01) | |
| F25B 41/385 | (2021.01) | |

(Continued)

(52) U.S. Cl.
CPC ......... H05K 7/20381 (2013.01); F25B 41/20 (2021.01); F25B 41/24 (2021.01); H05K 7/20345 (2013.01); F25B 41/31 (2021.01); F25B 41/385 (2021.01); F25B 49/02 (2013.01); F25B 2400/13 (2013.01); F25B 2400/23 (2013.01); F25B 2600/2513 (2013.01); F25B 2700/21151 (2013.01); F28D 15/0266 (2013.01)

(58) Field of Classification Search
None
See application file for complete search history.

(56) References Cited

U.S. PATENT DOCUMENTS

| | | |
|---|---|---|
| 3,427,819 A | 2/1969 | Seghetti |
| 5,228,301 A | 7/1993 | Sjoholm |

(Continued)

FOREIGN PATENT DOCUMENTS

| | | |
|---|---|---|
| CA | 2053055 | 4/1992 |
| CN | 104534710 A | 4/2015 |

(Continued)

*Primary Examiner* — Courtney L Smith
(74) *Attorney, Agent, or Firm* — Finnegan, Henderson, Farabow, Garrett & Dunner LLP

(57) ABSTRACT

The present disclosure provides methods and systems for heat exchange, such as cooling a heat source. A cooling system of the present disclosure may comprise a first channel that is configured to direct a liquid coolant, a second channel that is configured to direct a vapor coolant generated from the liquid coolant, and a condenser that is configured to permit the vapor coolant to undergo phase transition to the liquid coolant. The cooling system may further comprise at least one cooling interface in fluid communication with the first channel and the second channel. The cooling interface may be configured to facilitate heat exchange between the liquid coolant and a heat source.

18 Claims, 8 Drawing Sheets

Related U.S. Application Data 2018, now Pat. No. 11,365,906, application No. 17/844,134 is a continuation-in-part of application No. 16/493,350, filed as application No. PCT/IL2018/050280 on Mar. 9, 2018, now Pat. No. 11,778,783.

(60) Provisional application No. 62/535,912, filed on Jul. 23, 2017, provisional application No. 62/470,911, filed on Mar. 14, 2017, provisional application No. 62/470,262, filed on Mar. 12, 2017.

(51) Int. Cl.
 *F25B 49/02* (2006.01)
 *F28D 15/02* (2006.01)

(56) References Cited

U.S. PATENT DOCUMENTS

| | | | |
|---|---|---|---|
| 5,317,905 A | 6/1994 | Johnson | |
| 6,662,576 B1 | 12/2003 | Bai | |
| 8,174,828 B2 * | 5/2012 | Tilton | H01L 23/427 |
| | | | 361/689 |
| 8,964,390 B2 * | 2/2015 | Campbell | B23P 15/26 |
| | | | 361/679.53 |
| 9,025,330 B2 | 5/2015 | Hodes | |
| 10,412,860 B1 | 9/2019 | Goldsmith | |
| 10,602,635 B2 | 3/2020 | Ditri | |
| 11,109,516 B2 * | 8/2021 | Jing | H05K 7/20818 |
| 2001/0020365 A1 * | 9/2001 | Kubo | H05K 7/20309 |
| | | | 257/E23.099 |
| 2002/0007641 A1 | 1/2002 | Marsala | |
| 2002/0157409 A1 | 10/2002 | Pham | |
| 2003/0196445 A1 | 10/2003 | Cho | |
| 2005/0115257 A1 | 6/2005 | Goth | |
| 2006/0065386 A1 | 3/2006 | Alam | |
| 2006/0272342 A1 * | 12/2006 | Bash | F24F 11/30 |
| | | | 62/199 |
| 2013/0025304 A1 | 1/2013 | Dorman | |
| 2014/0216688 A1 | 8/2014 | Shelnutt et al. | |
| 2014/0345829 A1 | 11/2014 | Kang et al. | |
| 2015/0114605 A1 * | 4/2015 | Dupont | F28D 15/043 |
| | | | 165/104.26 |
| 2015/0351290 A1 * | 12/2015 | Shedd | H05K 7/20809 |
| | | | 361/679.47 |
| 2016/0174417 A1 | 6/2016 | Hachiya et al. | |
| 2016/0330873 A1 | 11/2016 | Farshchian et al. | |
| 2020/0163254 A1 | 5/2020 | Eadelson | |

FOREIGN PATENT DOCUMENTS

| | | |
|---|---|---|
| CN | 204388425 | 6/2015 |
| DE | 102005021154 A | 11/2006 |
| DE | 102011081886 A1 | 2/2013 |
| EP | 0916914 A2 | 5/1999 |
| EP | 2734020 | 5/2014 |
| GB | 2190180 A | 11/1987 |
| GB | 2405688 A | 9/2005 |
| WO | 2009141282 A1 | 11/2009 |
| WO | 2017115359 A1 | 7/2017 |
| WO | 2018163180 A1 | 9/2018 |
| WO | 2018167773 A1 | 9/2018 |

* cited by examiner

SYSTEMS AND METHODS FOR HEAT EXCHANGE

CROSS-REFERENCE TO RELATED APPLICATIONS

This application is a continuation of U.S. patent application Ser. No. 16/633,063, filed Jan. 22, 2020, which is a U.S. National Phase entry under 35 U.S.C. § 371 from PCT International Application No. PCT/IL2018/050809, filed on Jul. 21, 2018, which claims priority to U.S. Provisional Application No. 62/535,912, filed on Jul. 23, 2017. This application is also a continuation-in-part of U.S. patent application Ser. No. 16/493,350, filed Sep. 12, 2019, which is a U.S. National Phase entry under 35 U.S.C. § 371 from PCT International Application No. PCT/IL2018/050280, filed on Mar. 9, 2018, which claims priority to U.S. Provisional Application No. 62/470,911, filed on Mar. 14, 2017 and to U.S. Provisional Application No. 62/470,262, filed on Mar. 12, 2017, the contents of all of which are incorporated herein by reference in their entireties.

BACKGROUND

A problem in the electronics and computer field is increased heat generation as computing performance increases. The trend toward ever increasing heat dissipation in microprocessor and amplifier based systems, such as those housed in telecommunication cabinets, server rooms (data center), and Cloud Computing centers, is becoming increasingly critical to the electronics industry. Thus, finding effective thermal solutions is of interest to reduce system costs and to increase performance.

Traditional refrigeration systems for cooling either cool the entire electronic system or the heat-generating components therein. Cooling technologies may be used to cool devices, device clusters, subassemblies, and cabinet or rack levels, all of which are within the original equipment manufacturers' (OEM's) products. Cooling of electric systems and devices may be further complicated because, in many cases, thermal regulation is added after manufacture of electronic systems and devices and are not considered in the system designs by the OEM. Equipment design may utilize the latest software or implement the latest semiconductor technology, but the thermal management architecture is generally relegated to the "later phases" of the new product design. As such, thermal management issues, associated with a designed electronic system, are often solved by the expedient of a secondary cooling or refrigeration system that is arranged in tandem with the electronics system.

SUMMARY

As recognized herein, finding effective thermal solutions for thermal regulation and management of electronic systems may be of interest to reduce cost and provide increased performance. The present disclosure provides cost effective and continuously operating thermal regulation and management of electronic devices or systems. This may be useful, for example, in regulating and maintaining a temperature of a source of thermal energy (e.g., heat source), such as, e.g., high power electronic systems and server rooms.

In an aspect, the present disclosure provides a cooling system, comprising: a first channel that is configured to direct a liquid coolant; a second channel that is configured to direct a vapor coolant generated from the liquid coolant; a condenser that is configured to permit the vapor coolant to undergo phase transition to the liquid coolant; and at least one cooling interface in fluid communication with the first channel and the second channel, wherein the at least one cooling interface comprises (i) a coolant inlet for directing the liquid coolant from the first channel towards the second channel; (ii) at least one heat exchange unit for permitting heat to flow from a source of thermal energy to the liquid coolant from the coolant inlet, thereby permitting the liquid coolant to undergo phase transition to the vapor coolant; and (iii) a coolant outlet comprising an outlet shut-off valve to permit the vapor coolant to controllably flow from the at least one heat exchange unit to the second channel.

In some embodiments, the system further comprises a flow generator in fluid communication with the first channel or the second channel. In some embodiments, the system is operated at a pressure of less than about 1 atmosphere. In some embodiments, the outlet shut-off valve is an electric or mechanical valve. In some embodiments, the system is self-regulating. In some embodiments, the system further comprises a control unit in communication with the outlet shut-off valve, condenser, flow generator, or any combination thereof. In some embodiments, the system further comprises a pressure regulator in fluid communication with the first channel, second channel, condenser, at least one cooling interface, or any combination thereof. In some embodiments, the pressure regulator controls a flow rate of the liquid coolant and/or the vapor coolant.

In some embodiments, the at least one cooling interface comprises two or more individual cooling interfaces. In some embodiments, the at least one cooling interface comprises two or more cooling interfaces, and wherein the two or more cooling interfaces are connected in series. In some embodiments, the at least one cooling interface comprises two or more cooling interfaces, and wherein the two or more cooling interfaces are connected in parallel. In some embodiments, the two or more cooling interfaces share the outlet shut-off valve. In some embodiments, the two or more cooling interfaces do not share the outlet shut-off valve.

In some embodiments, the cooling interface has a surface area of less than about 25 square centimeters. In some embodiments, the at least one cooling interface is in direct contact with the source of thermal energy. In some embodiments, the at least one cooling interface is in indirect contact with the source of thermal energy. In some embodiments, the system further comprises an orifice in fluid communication with the first channel or the second channel. In some embodiments, the orifice aids with creating a vacuum within the at least one cooling interface. In some embodiments, the system provides on demand cooling to the source of thermal energy by controlling an amount of coolant in the at least one cooling interface.

In some embodiments, the liquid coolant vaporizes between about 5° C. and about 60° C. In some embodiments, the system further comprises an expansion container, one or more splitters, a user interface, a thermocouple, a transmitter, a processor and a memory, or any combination thereof. In some embodiments, the first channel, second channel, condenser, and at least one cooling interface are part of a closed loop fluid flow path. In some embodiments, the closed loop fluid flow path is operated under low pressure. In some embodiments, the coolant inlet comprises an inlet shut-off valve. In some embodiments, the inlet shut-off valve is a float valve. In some embodiments, the float valve controls a level of liquid coolant in the at least one cooling interface. In some embodiments, the outlet shut-off valve maintains an amount of the vapor and/or liquid coolant within the at least one cooling interface thereby maintaining the source of thermal energy within a temperature range.

In another aspect, the present disclosure provides a method for controlling a temperature of a source of thermal energy, comprising: providing a cooling system comprising at least one cooling interface in fluid communication with a first channel, a second channel, and a condenser, wherein the at least one cooling interface comprises a coolant inlet, at least one heat exchange unit, and a coolant outlet comprising an outlet shut-off valve; directing a liquid coolant from the first channel to the at least one cooling interface; in the at least one cooling interface, using thermal energy from the at least one heat exchange unit to subject the liquid coolant to a first phase transition to form a vapor coolant; directing the vapor coolant from the at least one cooling interface through the second channel to the condenser; and subjecting the vapor coolant to a second phase transition to form the liquid coolant.

In some embodiments, the method further comprises activating a flow generator to direct flow of the liquid coolant and the vapor coolant. In some embodiments, the at least one cooling interface is in direct contact with the source of thermal energy. In some embodiments, the at least one cooling interface is in indirect contact with the source of thermal energy. In some embodiments, the at least one cooling interface comprises two or more cooling interfaces and wherein the two or more cooling interfaces are connected in series. In some embodiments, the at least one cooling interface comprises two or more cooling interfaces and wherein the two or more cooling interfaces are connected in parallel. In some embodiments, an individual outlet shut-off valve of an individual cooling interface of the two or more cooling interfaces is independently operable from another individual outlet shut-off valve of another individual cooling interface of the two or more cooling interfaces. In some embodiments, the two or more cooling interfaces share the outlet shut-off valve. In some embodiments, the two or more cooling interfaces do not share the outlet shut-off valve.

In some embodiments, the outlet shut-off valve is self-regulating. In some embodiments, the outlet shut-off valve is controlled by a controller. In some embodiments, the outlet shut-off valve maintains an amount of the vapor and/or liquid coolant within the at least one cooling interface thereby maintaining the source of thermal energy within a temperature range.

In some embodiments, the outlet shut-off valve maintains the vapor coolant within the at least one cooling interface when a temperature of the source of thermal energy is below a lower temperature threshold. In some embodiments, the liquid coolant is directed to the at least one cooling interface when a temperature of the heat source exceeds an upper temperature threshold. In some embodiments, the liquid coolant vaporizes between about 5° C. and about 50° C.

In some embodiments, the method further comprises, subsequent to subjecting the vapor coolant to a second phase transition, directing the liquid coolant to the first channel. In some embodiments, the cooling system dissipates greater than or equal to about 300 watts per square centimeters of heat. In some embodiments, the at least one cooling interface, first channel, second channel, condenser, and at least one cooling interface are part of a closed loop fluid flow path. In some embodiments, the closed loop fluid flow path is operated under low pressure. In some embodiments, the coolant inlet comprises an inlet shut-off valve. In some embodiments, the inlet shut-off valve is a float valve. In some embodiments, the float valve controls a level of liquid coolant in the at least one cooling interface.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details arc capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

FIG. 1A illustrates an air-based thermal regulation system; FIG. 1B illustrates a liquid-based thermal regulation system;

FIG. 4A schematically illustrates an example cooling system with a single shut-off valve regulating a single cooling interface; FIG. 4B schematically illustrates a cooling system with a single shut-off valve regulating multiple cooling interfaces; FIG. 4C schematically illustrates a cooling system with a single outlet shut-off valve regulating a single cooling interface; FIG. 4C schematically illustrates a cooling system with a single outlet shut-off valve regulating multiple cooling interfaces;

FIG. 5A schematically illustrates an example cooling interface with an inlet shut-off valve; FIG. 5B schematically illustrates an example cooling interface with an outlet shut-off valve and optional inlet shutoff valve.

DETAILED DESCRIPTION

Figure 1A:
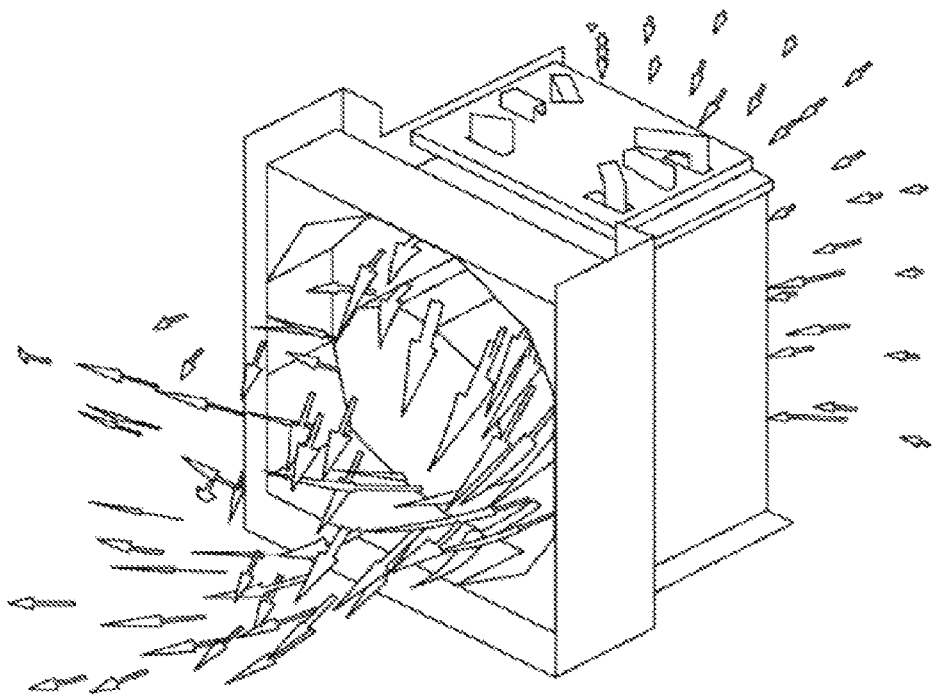
FIGS. 1A and 1B illustrate example single phase thermal regulation systems.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

As used herein, the term "condenser" generally refers to any device in which a vapor coolant is condensed to form a liquid coolant. The condenser may subject a vapor to undergo a phase change (or transition) to a liquid (i.e., condensation). For example, the condenser may condense a vapor coolant to a liquid coolant by altering the temperature of the coolant or the pressure of an environment containing the coolant. Heat removed from the coolant may be stored within the condenser or transmitted from the condenser, such as emitted from the condenser (e.g., using heat fins). Heat may be emitted to the surrounding free air environment of may be transferred to another heating, cooling, or thermal energy transfer device. The transfer of thermal energy may be achieved actively (e.g., by a fan attached to the condenser).

As used herein, the term "cooling interface" generally refers to any device that may absorb heat from a heat source (e.g., an electronic component). A cooling interface may be in direct contact with a heat source or indirect contact with a heat source (e.g., via an interface, mediator, or other heat conducting method, such as cooling pipes).

As used herein, the term "fluid" generally refers to a liquid or a gas. A fluid may not maintain a defined shape and may flow during an observable time frame to fill a container in which it is put. Thus, the fluid may have any suitable viscosity that permits flow. If two or more fluids are present, each fluid may be independently selected among essentially any fluid (liquids, gases, and the like).

As used herein, the term "coolant" generally refers to a substance, such as a liquid or a vapor (e.g., gas), that may be used to reduce, increase, or regulate the temperature of a heat source. The coolant can either maintain a phase or may undergo a phase transition during cooling, heating, or temperature regulation. In an example, the coolant may undergo a phase transition from a liquid phase to a gas phase to increase the cooling efficiency of the coolant.

As used herein, the term "channel" generally refers to a feature on or in a device or system that may at least partially direct flow of a fluid. A channel may have any cross-sectional shape (e.g., circular, oval, triangular, irregular, square, rectangular, etc.). A channel may be of any suitable length. The channel may be straight, substantially straight, or may contain one or more bends, curves, or branches.

As used herein, the term "flow generator" generally refers to a mechanism for directing fluid through a channel. The flow generator may be a pump(s), a compressor(s), an eductor or any other device that directs the flow of a fluid (e.g., liquid or vapor coolant). The flow generator may direct fluid flow in a pressurized, atmospheric, or vacuum system. In an example, the flow generator generates a vacuum in the system that facilitates fluid flow. The vacuum may be at a pressure of less than about 1 atmosphere (atm), or less than or equal to about 0.9 atm, 0.8 atm, 0.7 atm, 0.6 atm, 0.5 atm, 0.1 atm, 0.01 atm, 0.001 atm, or less.

The present disclosure provides systems and methods for heat exchange. Systems and methods of the present disclosure may be employed for use in various settings, such as for use in heat exchange with electronic systems (e.g. computer processors, computer servers, data centers, or network systems), energy storage systems (e.g., solid state batteries), charging systems, three dimensional (3D) printing systems, manufacturing systems, and wearable devices.

Thermal Regulation and Transfer of Thermal Energy

The present disclosure provides thermal management systems for regulating the temperature of electronic systems, heat-generating components thereof, and other heat generating systems (e.g., energy storage devises, three dimensional printing devices, etc.).

Thermal management or thermal regulation of electronic devices, including servers, central processing units (CPU), and graphics processing units (GPU), may increase the efficiency, longevity, and performance of such devices. Systems and methods for thermal regulation and transfer of thermal energy may include passive thermal regulation and active thermal regulation. Passive thermal regulation may include thermal regulation that does not use additional energy to provide thermal regulation. For example, passive thermal regulation of a device may include incorporating design features into the device that increase dissipation of thermal energy, such as heat sinks, heat spreaders, and heat pipes.

Active thermal regulation may include thermal regulation that uses additional energy to augment the thermal regulation process. Heat pumping thermal regulation may be achieved by material phase change, from liquid to gas, or by electro-cooling which may be highly inefficient. In some examples, the active thermal regulation may be provided by an external device (e.g., a fan). Methods of active thermal management may include forced air cooling, forced liquid cooling, solid-state heat pumps, electro-cooling and multiphase cooling. Current active thermal regulation systems and methods, such as the phase change cooling in refrigeration and air-conditioning systems, may employ forced condensation through pressurizing gas to at least about 10 atm and evaporating the gas during pressure decrease to below about 3 atm. Such systems, however, may be limited by the high pressure working volume, size, rigidity, and form factor of the required pressure vessel.

Figure 1B:
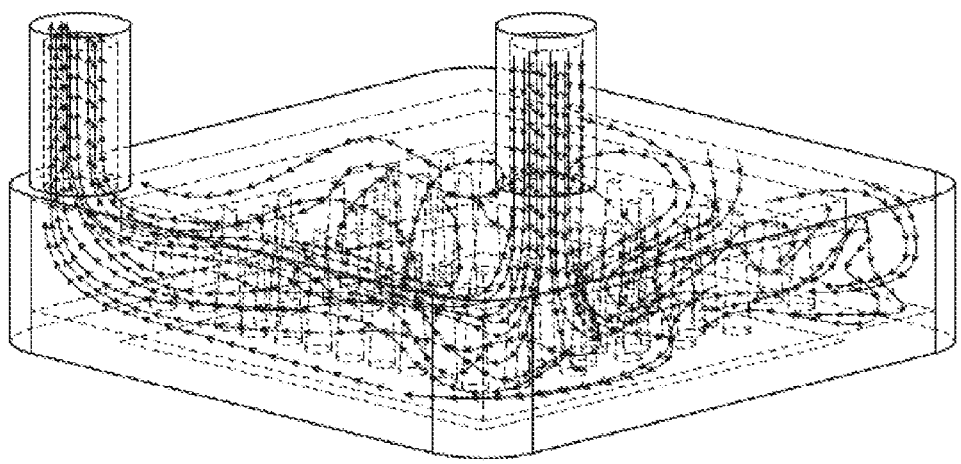

FIGS. 1A and 1B illustrate examples of single phase thermal regulation systems using a forced fluid. FIG. 1A shows an air-based thermal regulation system and FIG. 1B shows a liquid-based thermal regulation system. Single phase, force fluid (e.g., liquid or gas) thermal regulation systems may have limited cooling capabilities due to the ambient temperature in which the system operates. For example, an air-based single phase cooling system may not be capable of cooling a source of thermal energy below the ambient temperature due to the rate of heat transfer being proportional to the temperature gradient, as defined by Fourier's law. Thermal regulation systems may use cooled or chilled fluids to achieve cooling below ambient temperatures. The use of chilled fluids may inefficient as compared to a multiphase thermal regulation system.

Multiphase thermal regulation systems may use latent heat from a phase transition (e.g., from liquid to vapor) to cool below ambient temperatures. A multiphase thermal management system may be a two phase thermal regulation system. Multiphase thermal regulation systems may be high pressure systems or low pressure systems. High pressure systems may be operated at pressures above about 3 atmospheres (atm). High pressure systems may include a gas or vapor that undergoes forced condensation (e.g., using pressures greater than 10 atm) followed by evaporation via a pressure decrease (e.g., using pressures less than about 3 atm). The evaporation process may occur adjacent to a source of thermal energy and the latent heat used to convert the fluid from a liquid to a vapor may draw thermal energy from the source of thermal energy and, therefore, cool the source of thermal energy. High pressure multiphase thermal regulation systems may have a large form factor, use ridged materials, and have robust sealing mechanism due to the high pressure (e.g., greater than 10 atm) of the system.

Figure 2:
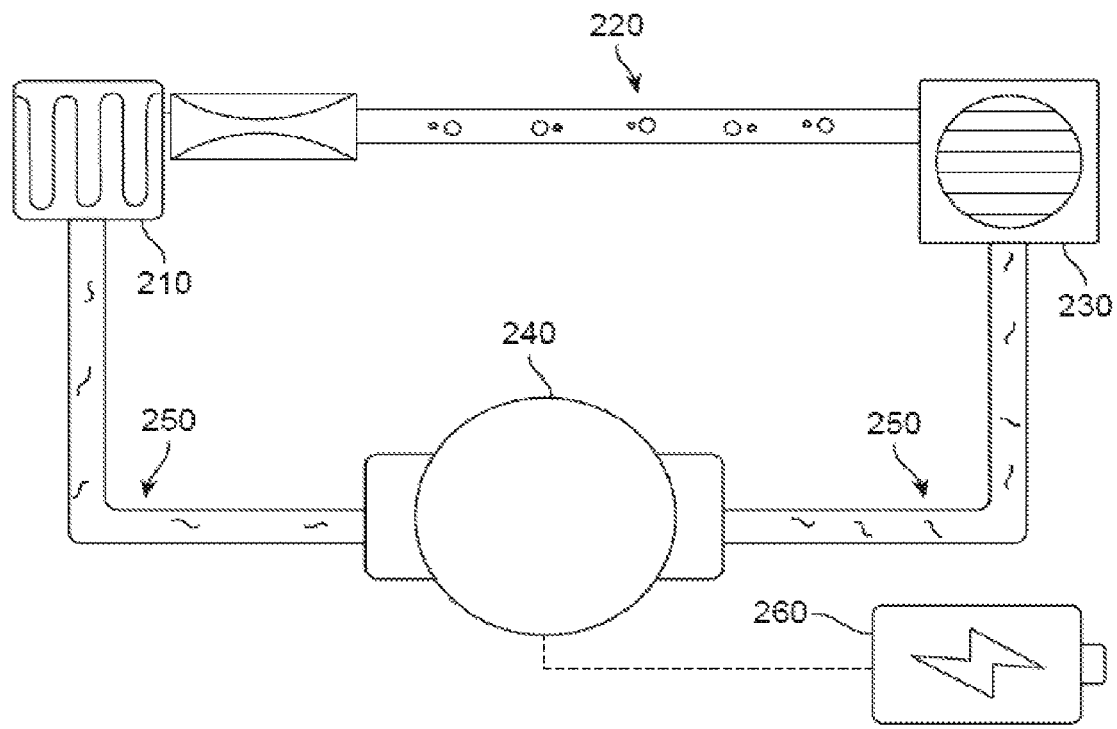
FIG. 2 illustrates an example low pressure, multiphase thermal regulation system.

Low pressure thermal regulation system may use forced evaporation as an alternative to forced condensation. Vacuum (e.g., to achieve a pressure below 1 atm) may be applied to a liquid when the liquid is in contact with or in thermal communication with a source of thermal energy. The transfer of thermal energy from the source to the fluid may cause the liquid to phase transition to a vapor. The transition from liquid to vapor may draw thermal energy from the source of thermal energy and, therefore, cool the source of thermal energy. The FIG. 2 shows an example low pressure multiphase thermal regulation system comprising a closed loop fluid flow path. The example low pressure thermal regulation system comprises a cooling interface 210. The cooling interface 210 may be in contact with or in thermal communication with a source of thermal energy. A liquid coolant 250 may enter the cooling interface 210 and, upon transfer of thermal energy from the source of thermal energy, may undergo a phase change to a vapor coolant 220. The vapor coolant 220 may be directed from the cooling interface 210 to a condenser 230. The condenser may enable the vapor coolant 220 to emit heat and phase transition to the liquid coolant 250, thus regenerating the liquid coolant 250. The system may include a vacuum or flow generator 240 to control and direct the flow of the liquid coolant 250. The vacuum or flow generator 240 may include a power supply 260 that powers the flow generator 240. The vacuum flow generator 240 may generate pressures less than or equal to 2 atmosphere (atms), 1.5 atm, 1 atm, 0.8 atm, 0.6 atm, 0.4 atm, 0.2 atm, 0.1 atm, or less.

Figure 3:
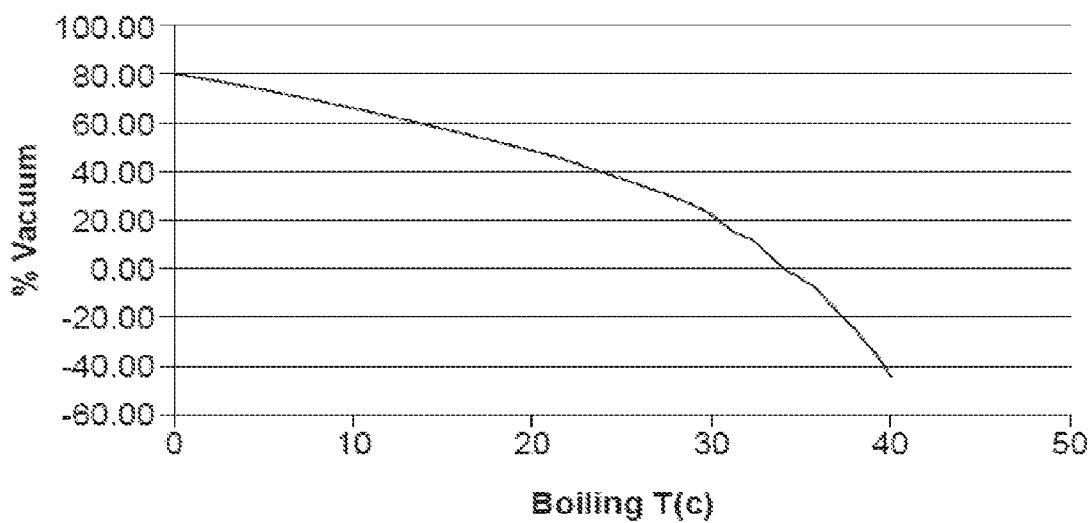
FIG. 3 shows an example plot of the boiling temperature of an example liquid coolant as a function of percent vacuum applied to a system.

The rate of cooling of a low pressure thermal regulation system may be dependent upon the pressure of the system, the flow rate of the coolant, the boiling point of the coolant, the temperature gradient between the coolant and the source of thermal energy, and the thermal conductivity between the source of thermal energy and the coolant. FIG. 3 shows an example plot of the boiling temperature of an example liquid coolant as a function of percent vacuum applied to a system. As the amount of vacuum is increased (e.g., the pressure of the system is reduced) the boiling point of the liquid coolant may decrease. As the amount of vacuum is decreased (e.g., the system becomes pressurized) the boiling point of the liquid coolant may increase. A liquid coolant that is in thermal communication with a heat source may undergo a temperature transition from the ambient temperature of the liquid coolant to the boiling point of the liquid coolant. As thermal energy continues to transfer to the liquid coolant, the liquid coolant may undergo a phase transition to a vapor coolant. The vapor coolant may continue to increase in temperature as thermal energy transfers from the heat source (e.g., source of thermal energy) to the vapor coolant. Thermal energy may be transferred from the source to the coolant during the changes in temperature of the coolant and the phase transition, however, the transfer of thermal energy may be more efficient during the phase transition than during the temperature change of the coolant. Thus, applying a vacuum to multiphase thermal regulation system may lower the boiling point of a liquid coolant and result in more efficient cooling of a source of thermal energy. Low pressure systems for thermal regulation are further described in PCT/IL2016/051384, PCT/IL2018/050280, and PCT/IL2018/050269, each of which is entirely incorporated herein by reference.

Systems for Cooling a Heat Source

In an aspect, the present disclosure provides systems for cooling a heat source and maintaining the heat source within a temperature window. The systems may comprise a closed loop fluid flow path under vacuum. The closed loop fluid flow path may include a first channel, a second channel, a condenser, and at least one cooling interface. The first channel (e.g., first fluid flow path) may be configured to direct a liquid coolant. The second channel (e.g., second fluid flow path) may be configured to direct a vapor coolant generated from the liquid coolant. The condenser may be configured to permit the vapor coolant to undergo a phase transition to the liquid coolant. The cooling interface may be in fluid communication with the first channel and the second channel. The cooling interface may include a coolant inlet, a heat exchange unit, and a coolant outlet. The first channel may direct the liquid coolant into the coolant inlet of the cooling interface. The coolant inlet direct and controls the flow of liquid coolant from the coolant inlet and towards the second channel. The coolant inlet may, or may not comprise an inlet shut-off valve. The heat exchange unit may permit heat to flow from a heat source to the liquid coolant. The heat may permit the liquid coolant to undergo a phase transition to a vapor coolant. The coolant outlet may permit the vapor coolant to flow from the heat exchange unit to the second channel. The coolant outlet may comprise an outlet shut-off valve. The outlet shut-off valve may permit or block the flow of vapor and/or liquid coolant from the cooling interface to the outlet channel. The system may absorb heat from a heat source by vaporizing the liquid coolant into a vapor coolant (e.g., through latent heat).

The system may be a high pressure (e.g., pressure greater than or equal to 2 atm), atmospheric pressure, or low pressure (e.g., pressure less than 2 atm) cooling system. In an example, the cooling system is a low pressure (e.g., vacuum) cooling system. The pressure of the cooling system may be constant throughout the system or may vary throughout the system. For example, the pressure may be greater in the condenser than in the channels or at the cooling interface. The pressure of the system may be less than or equal to about 5 atmospheres (atm), 4 atm, 3 atm, 2 atm, 1.5 atm, 1 atm, 0.8 atm, 0.6 atm, 0.4 atm, 0.2 atm, 0.1 atm, or less. The pressure of the system may be between about 5 atm and 0.1 atm, 4 atm and 0.1 atm, 3 atm and 0.1 atm, 2 atm and 0.1 atm, 1.5 atm and 0.1 atm, 1 atm and 0.1 atm, 0.8 atm and 0.1 atm, 0.6 atm and 0.1 atm, 0.4 atm and 0.1 atm, or 0.2 atm and 0.1 atm. The pressure in the condenser may be greater than or equal to about 0.5 atm, 1 atm, 1.5 atm, 2 atm, 4 atm, 6 atm, 8 atm, 10 atm, or greater. The pressure of the condenser may be between about 0.5 atm and 1 atm, 0.5 atm and 1.5 atm, 0.5 atm and 2 atm, 0.5 atm and 4 atm, 0.5 atm and 6 atm, 0.5 atm and 8 atm, or 0.5 atm and 10 atm. The pressure at the cooling interface may be less than or equal to about (atm), 4 atm, 3 atm, 2 atm, 1.5 atm, 1 atm, 0.8 atm, 0.6 atm, 0.4 atm, 0.2 atm, 0.1 atm, or less. The pressure at the cooling interface may be between about 5 atm and 0.1 atm, 4 atm and 0.1 atm, 3 atm and 0.1 atm, 2 atm and 0.1 atm, 1.5 atm and 0.1 atm, 1 atm and 0.1 atm, 0.8 atm and 0.1 atm, 0.6 atm and 0.1 atm, 0.4 atm and 0.1 atm, or 0.2 atm and 0.1 atm. The difference in pressure between the cooling interface and other portions of the system (e.g., condenser, flow generator, channels) may be greater than or equal to about zero atm, 0.1 atm, 0.2 atm, 0.4 atm, 0.6 atm, 0.8 atm, 1 atm, 1.5 atm, 2 atm, 4 atm, 6 atm, 8 atm, 10 atm, or more. The difference in pressure between the cooling interface and other portions of the system (e.g., condenser, flow generator, channels) may be less than or equal to about 10 atm, 8 atm, 6 atm, 4 atm, 2 atm, 1.5 atm, 1 atm, 0.8 atm, 0.6 atm, 0.4 atm, 0.2 atm, 0.1 atm, or less.

The outlet shut-off valve may prevent or block the flow of a portion (e.g., may meter the flow) or all of the coolant from the cooling interface to the outlet channel. The reduced or blocked flow may maintain the coolant within the cooling interface and may increase the pressure within the cooling interface and, thus, increase the boiling point of the liquid coolant. Increasing the pressure within the cooling interface may reduce or prevent the coolant form undergoing a phase transition from a liquid coolant to a vapor coolant. The pressure within the cooling interface may increase by greater than or equal to about 0.05 atm, 0.1 atm, 0.2 atm, 0.3 atm, 0.4 atm, 0.5 atm, 0.6 atm, 0.7 atm, 0.8 atm, 0.9 atm, 1 atm, 1.2 atm, 1.5 atm, 2 atm, 4 atm, 6 atm, 8 atm, 10 atm, or more. The outlet shut-off valve may maintain the pressure within the cooling interface within a pressure range by blocking or metering (e.g., reducing) the flow of vapor and/or liquid coolant from the cooling interface. The outlet shut-off valve may maintain the pressure of the cooling interface between about 5 atm and 0.1 atm, 4 atm and 0.1 atm, 3 atm and 0.1 atm, 2 atm and 0.1 atm, 1.5 atm and 0.1 atm, 1 atm and 0.1 atm, 0.8 atm and 0.1 atm, 0.6 atm and 0.1 atm, 0.4 atm and 0.1 atm, or 0.2 atm and 0.1 atm.

The cooling system may cool or maintain a temperature of a heat source by absorbing, or not absorbing, heat from the heat source. Thermal energy may be absorbed by the cooling interface. The cooling interface may include one or more heat exchange units or heat sinks that take heat from the heat source and provide the heat to the liquid coolant. The heat exchange units may comprise a material with high thermal conductivity, such as, for example, metals (e.g., copper, aluminum, iron, steel, etc.), non-metal conductors (e.g., graphite or silicon), heat transfer fluids, or any combination thereof. Non-limiting examples of heat transfer fluids may include halon replacement fluids (e.g., Novec fluids), R245fa, R123, R514a, other low pressure coolants, or any combination thereof. The heat exchange unit or heat sink may comprise a chamber, channels, or fins. The heat sink or heat exchange unit may generate a thin layer of liquid coolant in thermal communication with the heat source. The thin layer of coolant may increase the efficiency of cooling. The heat exchange unit may comprise a thin chamber. The coolant may flow parallel to a long dimension of the chamber. The chamber may have a height (e.g., distance perpendicular to the direction of fluid flow) of less than or equal to about 10 centimeters (cm), 8 cm, 6 cm, 5 cm, 4 cm, 3 cm, 2 cm, 1 cm, 0.5 cm, 0.25 cm, or less. The chamber may have a height of greater than or equal to about 0.25 cm, 0.5 cm, 1 cm, 2 cm, 3 cm, 4 cm, 5 cm, 6 cm, 8 cm, 10 cm, or more. The chamber may have a volume of less than or equal to about 4,000 cubic centimeters ($cm^3$), 3,500 $cm^3$, 3,000 $cm^3$, 2,500 $cm^3$, 2,000 $cm^3$, 1,500 $cm^3$, 1,000 $cm^3$, 750 $cm^3$, 500 $cm^3$, 250 $cm^3$, 200 $cm^3$, 150 $cm^3$, 100 $cm^3$, 75 $cm^3$, 50 $cm^3$, 25 $cm^3$, 20 $cm^3$, 15 $cm^3$, 10 $cm^3$, 8 $cm^3$, 6 $cm^3$, 4 $cm^3$, 2 $cm^3$, 1 $cm^3$, 0.5 $cm^3$, or less. The chamber may have a volume of greater than or equal to about 0.5 $cm^3$, 1 $cm^3$, 2 $cm^3$, 4 $cm^3$, 6 $cm^3$, 8 $cm^3$, 10 $cm^3$, 15 $cm^3$, 20 $cm^3$, 25 $cm^3$, 50 $cm^3$, 75 $cm^3$, 100 $cm^3$, 150 $cm^3$, 200 $cm^3$, 250 $cm^3$, 500 $cm^3$, 750 $cm^3$, 1,000 $cm^3$, 1,500 $cm^3$, 2,000 $cm^3$, 2,500 $cm^3$, 3,000 $cm^3$, 3,500 $cm^3$, 4,000 $cm^3$, or more. The heat sink or heat exchange unit may have a cooling area of greater than or equal to about 0.5 squared centimeters ($cm^2$), 1 $cm^2$, 2 $cm^2$, 4 $cm^2$, 6 $cm^2$, 8 $cm^2$, 10 $cm^2$, 15 $cm^2$, 20 $cm^2$, 30 $cm^2$, 40 $cm^2$, 50 $cm^2$, 75 $cm^2$, 100 $cm^2$, 150 $cm^2$, 200 $cm^2$, 300 $cm^2$, 350 $cm^2$, 400 $cm^2$, or more. The heat sink or heat exchange unit may have a cooling area of less than or equal to 400 $cm^2$, 350 $cm^2$, 300 $cm^2$, 250 $cm^2$, 200 $cm^2$, 150 $cm^2$, 100 $cm^2$, 75 $cm^2$, 50 $cm^2$, 40 $cm^2$, 30 $cm^2$, 20 $cm^2$, 15 $cm^2$, 10 $cm^2$, 8 $cm^2$, 6 $cm^2$, 4 $cm^2$, 2 $cm^2$, 1 $cm^2$, 0.5 $cm^2$, or less.

The heat absorption via a cooling interface may be achieved through liquid coolant vaporization. Vaporization may be achieved by applying vacuum onto the coolant or cooling agent within the cooling interface(s). Alternatively, or in addition to, vaporization may be achieved by allowing the coolant to evaporate and evacuating the gaseous coolant. The evaporated coolant may be removed or taken away from the cooling interface and directed to the condenser. The condenser may condense the vapor coolant to form a liquid coolant. The absorbed heat may be emitted from the condenser to the surrounding environment (e.g., surrounding air) or to another device. The liquid coolant may flow from the condenser to the cooling interface. Alternatively, or in addition to, the liquid coolant may flow from the condenser to a flow generator or other vacuum component of the cooling system.

Figure 4A:
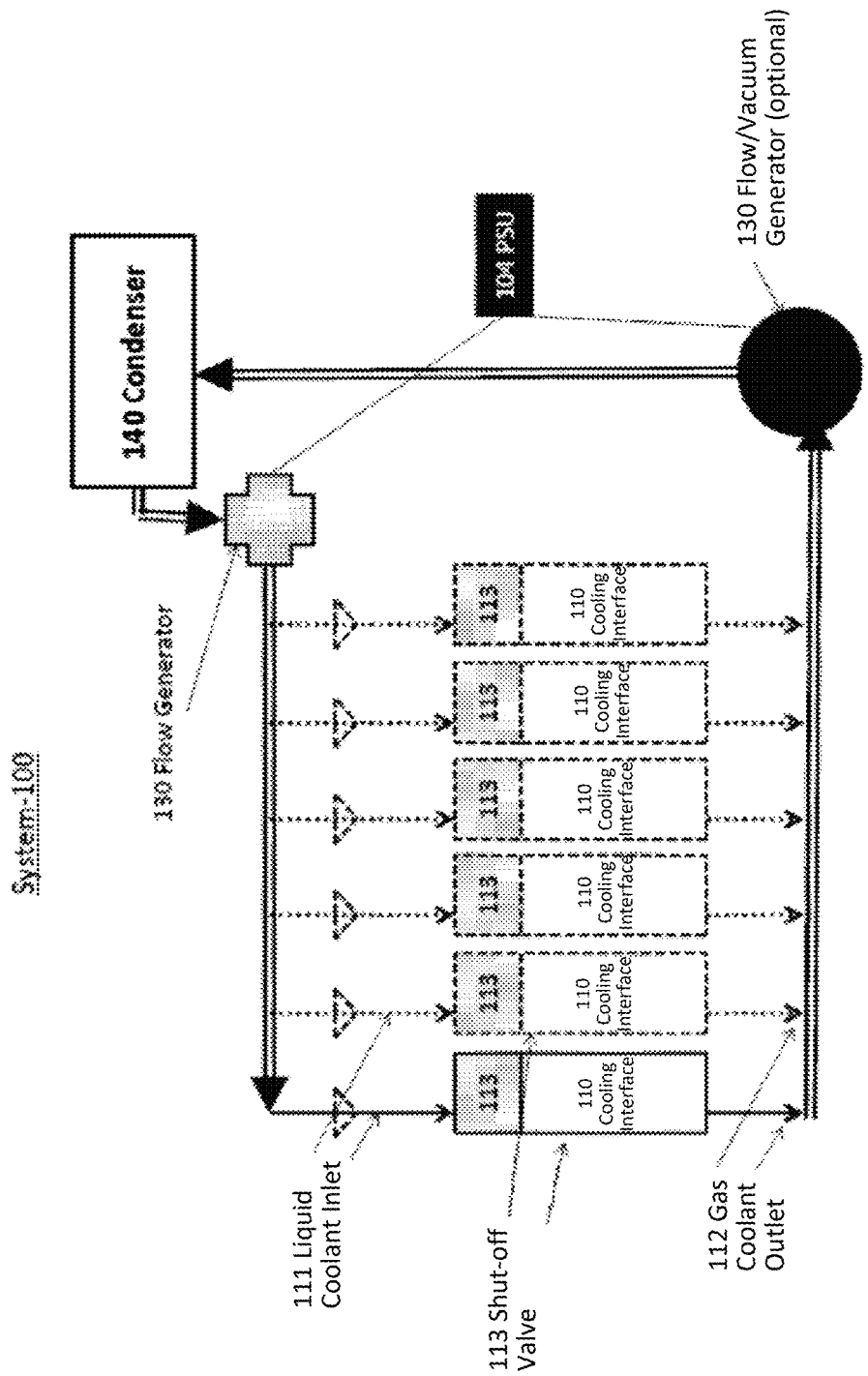
FIGS. 4A-4D schematically illustrate example cooling systems with one or more cooling interfaces.
Figure 4B:
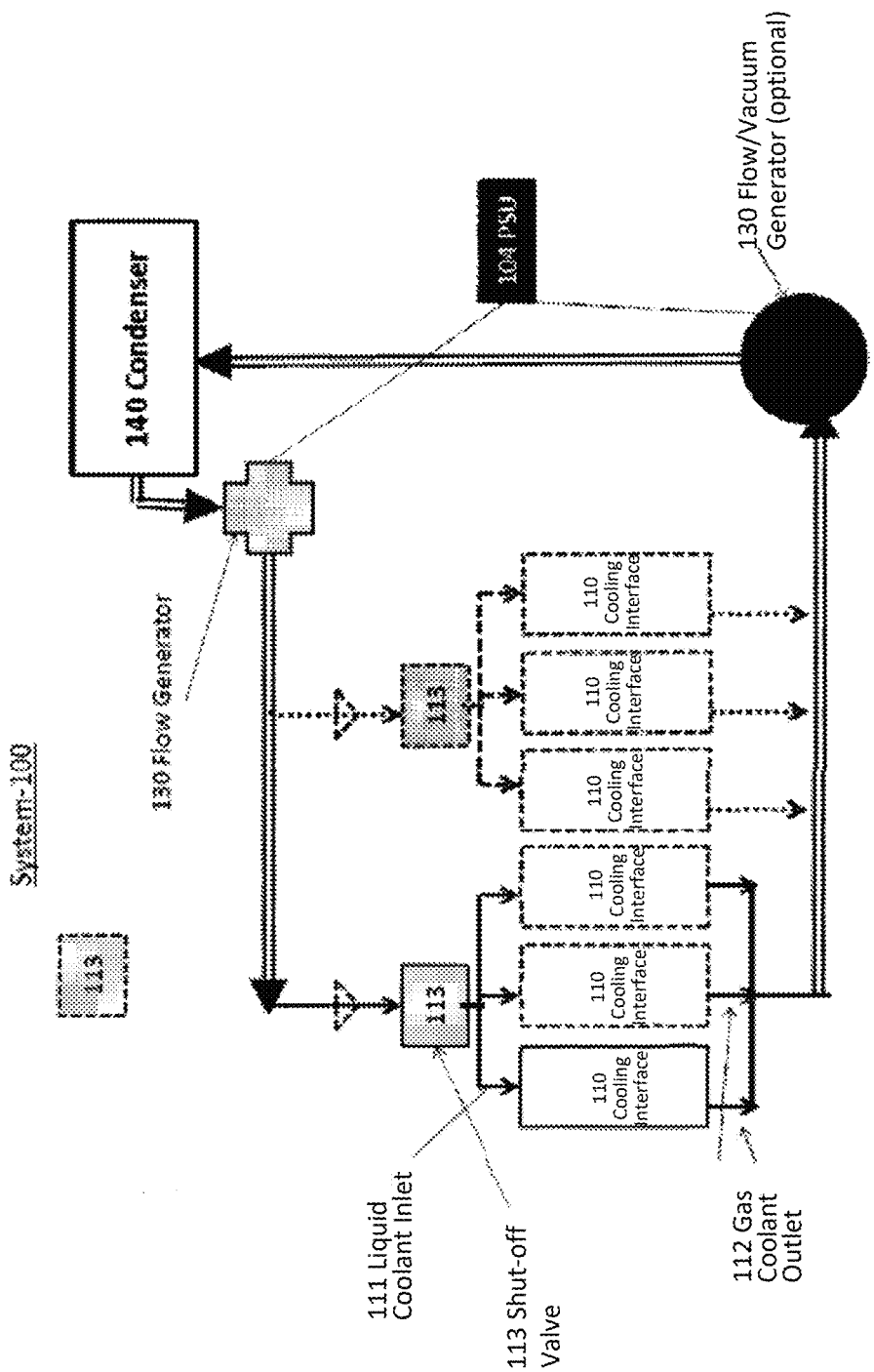

FIGS. 4A and 4B schematically illustrate an example cooling systems with one or more cooling interfaces 110. The cooling system 100 may include one or more fluid flow channels and multiple cooling interfaces 113. The cooling interfaces may include a liquid coolant inlet 111, an inlet shut-off valve 113 to control the flow of liquid coolant into the cooling interface, and a gas or vapor coolant outlet 112. The system may further comprise a condenser 140, one or more flow generators 130, and a power supply 104 coupled to the flow generators. The liquid coolant may flow from the condenser 140, through a channel, and to the liquid coolant inlet 111. The inlet shut-off valve 113 may block the liquid coolant from entering the cooling interface 110 or may permit the liquid coolant to enter the cooling interface 110. The cooling interface 110 may be in contact with a heat source and heat may be transferred from the heat source to the liquid coolant. The liquid coolant may be vaporized and may exit the cooling interface through the gas coolant outlet 112 to be directed to the condenser. The system 100 may include multiple cooling interfaces 110 and multiple inlet shut-off valves 113. Each inlet shut-off valve may be in fluid communication with a single cooling interface 110 as shown in FIG. 4A. Alternatively, or in addition to, each inlet shut-off valve may be in fluid communication with multiple cooling interfaces 110 as shown in FIG. 4B.

Figure 4C:
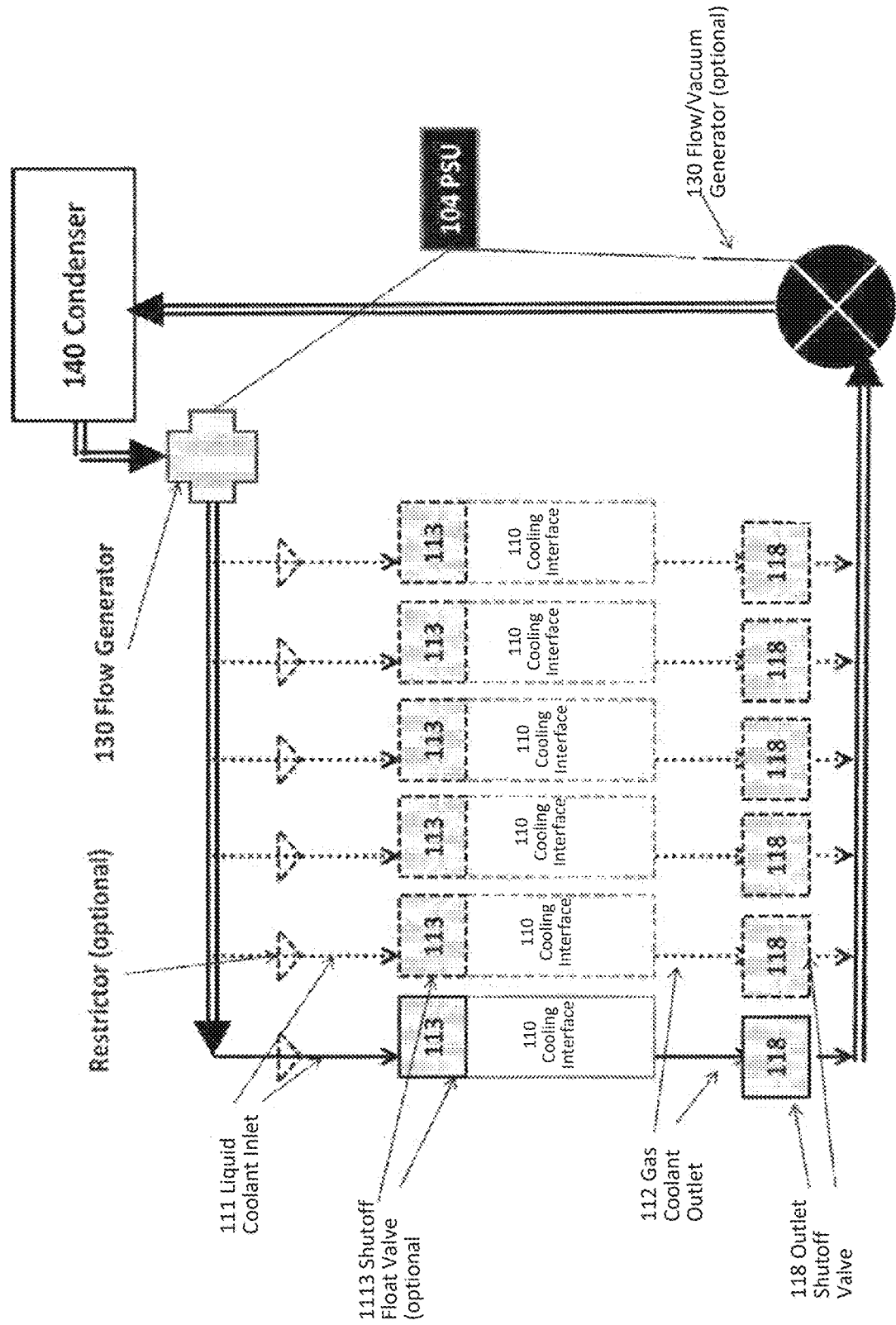
Figure 4D:
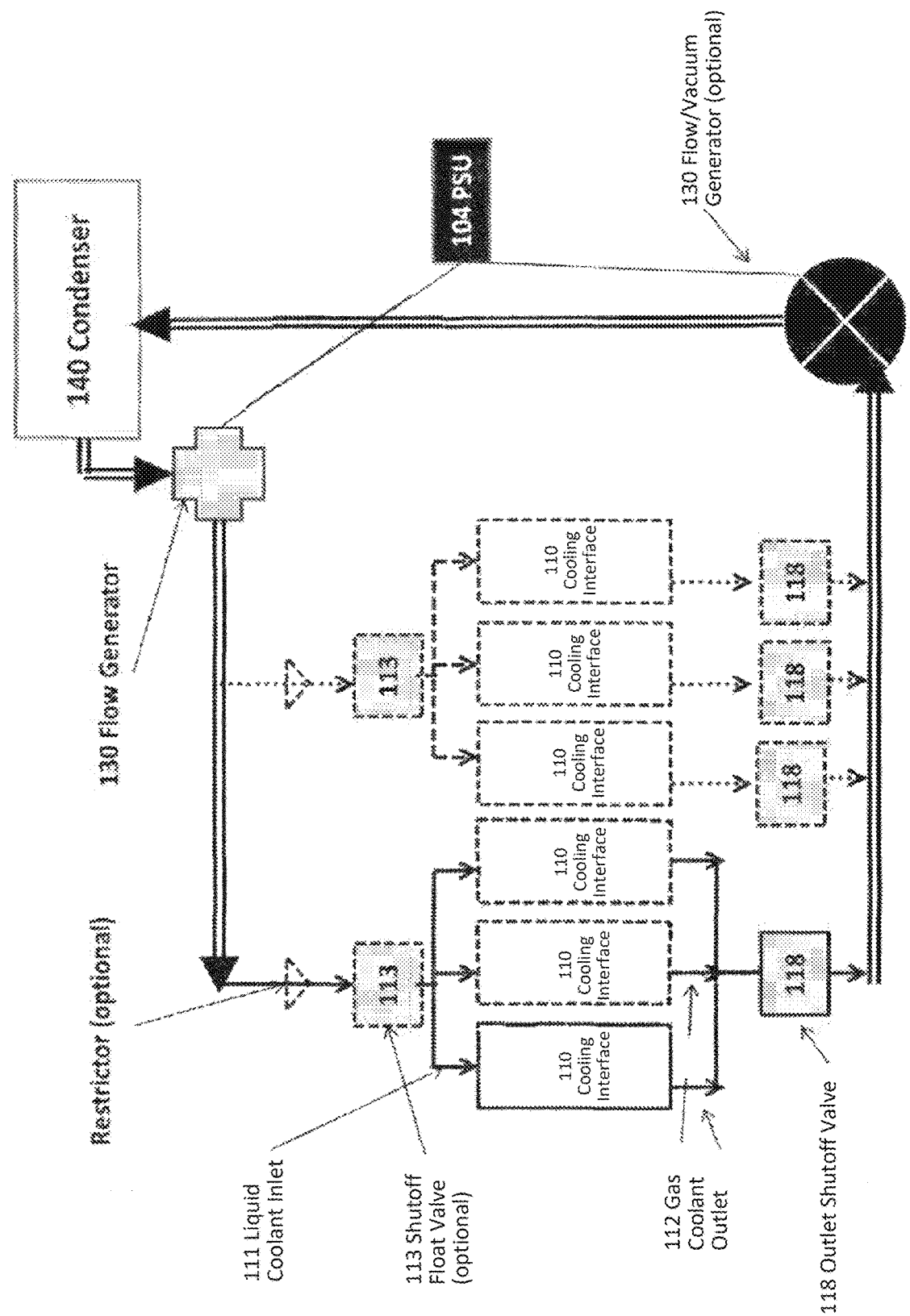

FIGS. 4C and 4D schematically illustrate an example cooling system 100 with one or more cooling interfaces 110 in fluid communication with one or more coolant outlets 112. The one or more coolant outlets may include one or more outlet shut-off valves 118. The outlet shut-off valve 118 may aid in controlling the amount of coolant in the cooling interface 110 and the pressure of the cooling interface 110, thereby maintaining the temperature of the heat source. The cooling system 100 may comprise a first channel, a second channel, a condenser 140, and one or more cooling interfaces 110. The first channel may be configured to direct a liquid coolant to the cooling interface 110. The first channel may be in fluid communication with an inlet shut-off valve 113. Alternatively, or in addition to, the first channel may not include an inlet shut-off valve 113. The second channel may be configured to direct a vapor coolant generated from the liquid coolant to the condenser 140. The condenser 140 may be configured to permit the vapor coolant to undergo phase transition to the liquid coolant. The at least one cooling interface may be in fluid communication with the first channel and the second channel. At least one cooling interface may comprise a coolant inlet 111, at least one heat exchange unit, and the coolant outlet 112 comprise with an outlet shut-off valve 118. The coolant inlet 111 may comprise an inlet shut-off valve 113 for directing the liquid coolant from the first channel towards the second channel. The at least one heat exchange unit may permit heat to flow from a source of thermal energy to the liquid coolant from the coolant inlet 111. At least one heat exchange unit may permit the liquid coolant to undergo phase transition to the vapor coolant. The coolant outlet 112 comprising the outlet shut-off valve 118 may permit the vapor coolant to controllably flow from the at least one heat exchange unit to the second channel. The system 100 may include multiple coolant outlets 112 and multiple outlet shut-off valves 118. Each shut-off valve may be in fluid communication with a single cooling interface 110 as shown in FIG. 4C. Alternatively, or in addition to, each outlet shut-off valve 118 may be in fluid communication with multiple cooling interfaces 110 as shown in FIG. 4D. In an example, a portion of the cooling interfaces 110 are in fluid communication with a single outlet shut-off valve 118 and, optionally a single inlet shut-off valve 113. In another example, individual cooling interfaces 110 are in fluid communication with individual outlet 118 and, optionally, inlet 113 shut-off valves. A system may include a mixture of cooling interfaces associated with individual inlet and/or outlet shut-off valves and multiple cooling interfaces associated with a single inlet and/or outlet shut-off valves.

The cooling system may further include a flow generator. The flow generator may be a pump, compressor, educator, or any other device designed to direct fluid flow. The cooling system may include at least 1, 2, 3, 4, 5, or more flow generators. The flow generators may be the same type of flow generator. Alternatively, the system may not include a flow generator. The flow generator may be controlled by a control unit that can activate the flow generator when a temperature threshold is reached or when faster heat removal is required. The flow generator may permit the system to operate at a low pressure (e.g., less than 2 atm). Such low pressure system may operate, for example, at a pressure that is less than or equal to about 2 atm, 1.5 atm, 1 atm, 0.5 atm, 0.1 atm, or less (e.g., under vacuum). For example, the flow generator may generate a vacuum that directs flow of the coolant in its liquid form and/or its gaseous form. The flow generator may direct fluid at a volumetric flow rate of greater than or equal to about 0.5 liters per hour (L/h), 1 L/h, 2 L/h, 5 L/h, 10 L/h, 20 L/h, 30 L/h, 40 L/h, 50 L/h, 100 L/h, 200 L/h, 300 L/h, 400 L/h, 500 L/h, 1,000 L/h, 2,000 L/h, 3,000 L/h, 4,000 L/h, 5,000 L/h, 10,000 L/h, 20,000 L/h, 30,000 L/h, 40,000 L/h, or greater. The flow generator may direct fluid at a volumetric flow rate of less than or equal to about 40,000 L/h, 30,000 L/h, 20,000 L/h, 10,000 L/h, 5,000 L/h, 4,000 L/h, 3,000 L/h, 2,000 L/h, 1,000 L/h, 500 L/h, 400 L/h, 300 L/h, 200 L/h, 100 L/h, 50 L/h, 40 L/h, 30 L/h, 20 L/h, 10 L/h, 5 L/h, 2 L/h, 1 L/h, 0.5 L/h, or less.

The flow generator may direct fluid flow from the condenser, through a channel to the cooling interface, and from the cooling interface back to the condenser. The system may include a 2, 3, 4, 5, 6, 8, 10, or more channels. In an example, the system includes a first channel and a second channel. The first channel may direct the flow of liquid coolant and the second channel may direct the flow of vapor coolant. The channels may be flexible or ridged. The channels may be formed of thermally insulating materials (e.g., plastics). The first and second channel may be formed of the same materials or may be formed of different materials. The channels may have a cross-sectional area that is constant or that varies. The first and the second channel may have the same cross-sectional area or may have different cross-sectional areas. For example, the cross-sectional area of the first channel (e.g., the channel directing the liquid coolant) may be smaller than the cross-sectional area of the second channel (e.g., the channel directing the vapor coolant).

The system may further comprise a plurality of outlet shut-off valves. The outlet shut-off valves may be disposed between the heat exchange unit of the cooling interface and the outlet channel. Alternatively, or in addition two, the outlet shut-off valves may be integrated with the outlet channel and/or or the cooling interface. In an example, the system includes multiple heat exchange units and each outlet shut-off valve controls the flow of fluid from a single heat exchange unit to the outlet channel. In another example, the one outlet shut-off valve controls fluid flow from more than one heat exchange units. The outlet shut-off valve may be a metered valve (e.g., controls the flow rate of the fluid) or may be a discrete valve (e.g., valve comprising an open state and a closed state). The outlet shut-off valve may be designed to allow vapor, liquid, and or vapor and liquid coolant to enter each associated outlet channel which is in fluid communication therewith, while preventing backflow of the vapor and/or liquid coolant.

The system may further comprise one or more inlet shut-off valves. In an example, the system comprises no inlet shut-off valves. In another example, the system comprises multiple inlet shut-off valves. The one or more inlet shut-off valves may be disposed between the first channel and the heat exchange unit of the cooling interface. In an example, the system includes multiple heat exchange units and each inlet shut-off valve controls the flow of fluid to a single heat exchange unit. In another example, one inlet shut-off valve controls fluid flow to more than one heat exchange units. The inlet shut-off valve may be integrated with the inlet channel and/or the cooling interface. The inlet shut-off valve may be a metered valve (e.g., controls the flow rate of the fluid) or may be a discrete valve (e.g., valve comprising an open state and a closed state). The inlet shut-off valve may be designed to allow liquid coolant to enter each associated cooling interface which is in fluid communication therewith, while preventing backflow of the liquid coolant as well as of the generated gaseous or vapor coolant.

The outlet and/or inlet shut-off valve may be a mechanical or electric valve. The outlet and/or inlet shut-off valve may be controlled by a control unit or may be physically controlled (e.g., by liquid coolant level). In an example, the outlet and/or inlet shut-off valve is a float valve designed to prevent liquid coolant from entering the associated cooling interface when the liquid coolant within the cooling interface unit reaches a predefined level/amount. In another example, the system comprises an outlet shut-off valve that is not a float valve and an inlet shut-off valve that is a float valve. For example, when the liquid level is below a threshold volume or level, the inlet shut-off float valve may be in an open position and allow liquid coolant to flow into the cooling interface. When the liquid level reaches the threshold volume or level the float valve may be in a closed interface and prevent liquid coolant from flowing into the cooling interface. Using a float valve may reduce the use of a flow generator to continuously flow the coolant through the cooling system which may reduce maintenance costs and redundant flow generators.

A float shut-off valve may increase the efficiency of the cooling system because liquid coolant enters the cooling interface in which the liquid coolant level has been dropped or reduced and not a cooling interface in which the liquid coolant level is above a threshold. The reduction in the liquid coolant volume or level may be indicative of on-going heat removal from the heat source being and which the cooling interface is thermally connected to or associated-with. Thus, the efficiency of the system may be increased because coolant is being delivered to the cooling interfaces undergoing heat removal and not to the cooling interfaces where heat is not being removed. Moreover, the rate and speed of liquid coolant entering each cooling interface may be controlled by the rate of evaporation, which may be equivalent to the amount of heat to be removed (e.g., the hotter the heat source, the faster the coolant within a specific cooling interface evaporates, and thus the rate at which the liquid coolant enters the specific cooling interface is faster, and vice-versa). This permits autonomous or on demand temperature control of the heat source to be cooled. A float valve may be in fluid communication with a single heat exchange unit or a float valve may be in fluid communication with multiple heat exchange units.

A cooling system comprising an outlet and/or inlet shut-off valve may be advantageous because the liquid coolant does not flow continuously and/or circularly (e.g., does not flow into and out of each cooling interface). The liquid coolant may enter each cooling interface of the system and vapor or gaseous coolant may exit or leave the cooling interface. The inlet shut-off valve may prevent liquid coolant, vapor coolant, or both liquid and vapor coolant from entering the first channel. The outlet shut-off valve may prevent liquid coolant, vapor coolant, or both liquid and vapor coolant from entering the second channel. In an example, the outlet and/or inlet shut-off valve permits the cooling system to be autonomous (e.g., to not use a control system to control the amount and speed of liquid coolant that is pumped through the system and into each cooling interface or the speed of removal of the vapor or gaseous coolant from the cooling interface).

Alternatively, or in addition to, the cooling system may further comprises a control unit for controlling the amount and speed of liquid coolant pumped through the system and/or into each cooling interface. The control unit may control the removal speed of coolant vapors from the cooling interface and/or the flow of ambient air through cooling fins of the condenser (e.g., fan speed). In an example, the liquid coolant flow rate and/or the gaseous coolant flow rate is controlled by at least one pressure regulator associated with flow generator. The control unit may be in communication with the inlet shut-off valve, outlet shut-off valve, or both the inlet and outlet shut-off valve. The control unit may signal the inlet shut-off valve to open with the temperature of the cooling interface or object to be cooled rises above an upper temperature limit or threshold. The control unit may signal the outlet shut-off valve to close when the temperature of the cooling interface or object to be cooled falls below a lower temperature limit or threshold.

The cooling interface may contain a threshold or residual amount of liquid coolant and either the inlet and/or the outlet shut-off valve may prevent liquid coolant from entering or leaving the cooling interface once the threshold level or amount has been reached. The inlet shut-off valve may permit the liquid coolant to enter the cooling interface once the coolant level has dropped below the threshold level. Alternatively, or in addition two, the outlet shut-off valve may prevent vapor and/or liquid coolant from flowing from the cooling interface once the coolant level has dropped below the threshold level. The level of the coolant in the cooling interface may be reduced due to evaporation of the liquid coolant. Evaporation of the liquid coolant may be due to the transfer of heat from the heat source to the liquid coolant.

The outlet and/or inlet shut-off valve may be any valve that is suitable for permitting one-directional flow, which directs coolant to flow into cooling interface(s) or to the outlet channel, while preventing backflow of the liquid or vapor coolant. The outlet and/or inlet shut-off valve may be a mechanical or electric float valve.

Figure 5A:
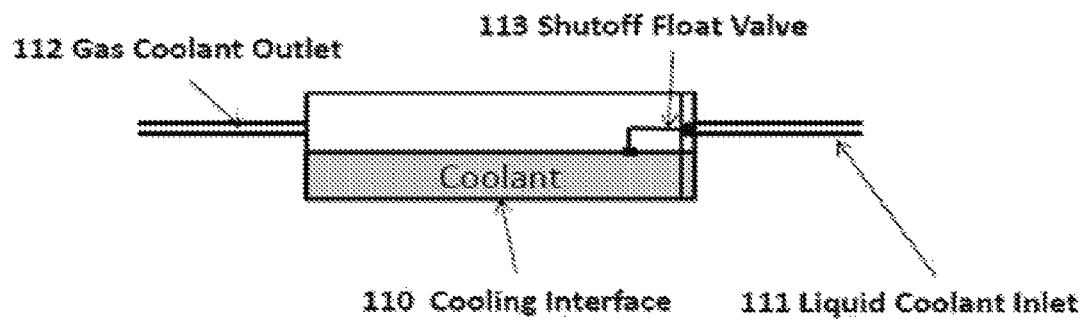
FIGS. 5A and 5B schematically illustrate example shut-off valves for regulating the level of liquid coolant present at the cooling interface.
Figure 5B:
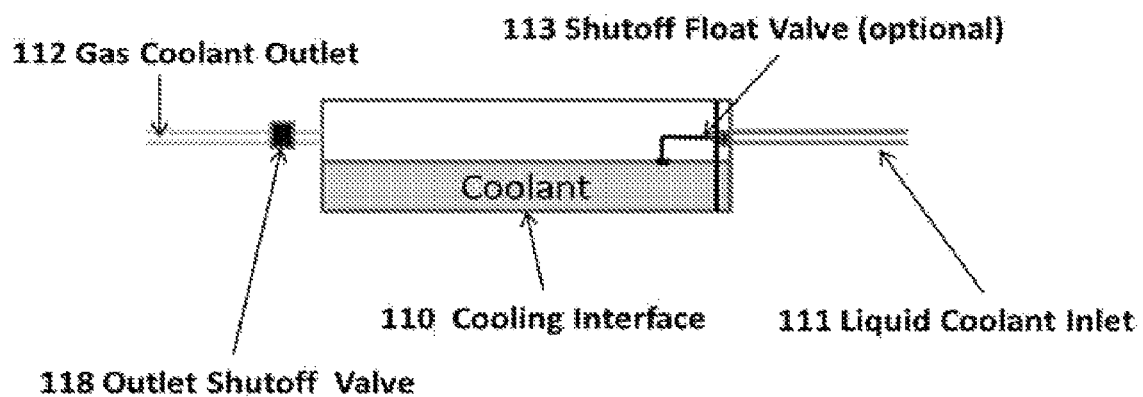

Example shut-off valves are illustrated in FIGS. 5A and 5B. FIG. 5A illustrates an example cooling interface 110 with an inlet shut-off valve. The valve may be a float valve or other type of valve. FIG. 5B illustrates and example of a cooling interface 110 with an outlet shut-off valve 118 and inlet shut-off valve 113. The inlet shut-off valve 113 may be an optional component of the system. The inlet shut-off valve 113 may permit control of the level of the coolant within the cooling interface 110. For example, a system may comprise a liquid coolant inlet 111 that provides liquid coolant to the cooling interface 110. The system may additionally comprise a gas coolant outlet 112 that removes gas coolant from the cooling interface 110. The gas coolant outlet may further comprise an outlet shut-off valve 118. The outlet shut-off valve 118 may permit the regulation of the pressure of the cooling interface and, therefore, may permit maintaining the cooling interface 110 within a window or range of temperatures. The inlet shut-off valve 113 may be disposed adjacent to the liquid coolant inlet 111 of the cooling interface 110. The shut-off float valve may include a float that is disposed at the interface between the liquid coolant and the vapor coolant. The shut-off float valve may indicate the liquid coolant level within the cooling interface. A decrease in the liquid coolant level may cause the position of the float to decreases the valve to open. An increase in the liquid coolant level may cause the position of the float to increase and the valve to close.

An inlet and an outlet shut-off valve may be the same type of valve or may be a different valve. For example, the inlet valve may be a float valve and the outlet shut-off valve may be a pneumatic, electric, or mechanical valve. The outlet shut-off valve may be a two stage valve with an open and/or close setting or a multi-stage valve that may limit or restrict (e.g., regulate) outlet gas flow from the one or more cooling interfaces. The inlet, outlet, or both the inlet and outlet shut-off valves may be controlled using a solenoid for opening and closing the valve. The outlet and/or inlet shut-off valve may include additional components, such as springs, diaphragms, pneumatic components, or additional fluids to permit the valve to block, partially block, or meter flow of the liquid coolant and/or vapor coolant.

The inlet shut-off float valve may be a mechanical shut-off valve. The specific gravity of the float portion of the valve may be less than the specific gravity of the coolant. Accordingly, when no external forces are applied other than the force of the coolant level rising, the inlet shut-off valve may be lifted and block or close the coolant flow path into the cooling interface. As the coolant evaporates, the liquid level may decrease and the valve may lower and open or unblock the coolant flow path into the cooling interface. Once the liquid coolant level within the cooling interface begins to drop, the valve may automatically open to allow liquid coolant to enter the cooling interface. The flow rate of the liquid coolant into the cooling interface may directly correlate to the amount of gaseous or vapor coolant exiting the cooling interface. The amount of vapor coolant generated may be a direct effect of the heat generated by the heat source to be cooled. Using an inlet shut-off float valve may eliminate the use of sophisticated and complex controlling and adjusting mechanism(s) and monitoring of the cooling process. In an example, the forces induced by the specific gravity differences (e.g., between the valve specific gravity and the coolant specific gravity), is high enough to block, partially block, or meter the flow of liquid coolant to or through the liquid coolant inlet. The inlet shut-off valve may include additional components, such as springs, diaphragms, pneumatic components, or additional fluids to permit the valve to block, partially block, or meter flow of the liquid coolant.

The cooling system may have a single cooling interface or multiple cooling interfaces. The cooling system may have at least 2, 3, 4, 6, 8, 10, 20, 40, 60, 80, 100, or more cooling interfaces. The cooling system may include cooling interfaces connected in a parallel or series configuration. The cooling system may include at least one line or set of 2, 3, 4, 5, 6, 7, 8, 9, 10 or more cooling interface connected in a series configuration. Alternatively, or in addition to, the cooling system may have at least one line or set of 2, 3, 4, 5, 6, 7, 8, 9, 10 or more cooling interface connected in parallel. In an example, the cooling system comprises at least one line or set of 2, 3, 4, 5, 6, 7, 8, 9, 10 or more cooling interface connected both in series and in parallel. The cooling interfaces of the system may be grouped such that a single outlet shut-off valve controls the flow of coolant from the group of cooling interfaces. The cooling system may have multiple groups of cooling interfaces, each in fluid communication with a single outlet shut-off valve. A group of cooling interfaces may include at least 2, 3, 4, 5, 6, 7, 8, 9, 10, or more cooling interfaces. A cooling system may include at least 2, 3, 4, 5, 6, 7, 8, 9, 10, 20, 30, 40, 50, or more groups of cooling interfaces.

The cooling system may include one or more coolants or cooling agents. The coolant may be a refrigerant, a dielectric fluid, or any fluid with a high latent heat of evaporation. The liquid coolant may be non-corrosive and may be compatible with electronic components. The liquid coolant may also be non-toxic and non-flammable. The coolant may comprise aromatic, silicate-ester, aliphatic, silicone, or fluorocarbon compounds. The coolant may include alcohol, water, glycol, a salt solution, or any combination thereof. The cooling system may be provided empty (e.g., without any coolant) and coolant may be added to the system after installation of the cooling system. The coolant or cooling agent may vaporize at less than or equal to about 1 atm at a low temperature. The coolant may vaporize at a pressure of less than or equal to about 1 atm and a temperature between about 0° C. to about 40° C., about 0° C. to about 30° C., about 0° C. to about 20° C., about 0° C. to about 10° C., about 5° C. to about 25° C., about 10° C. to about 25° C., about 15° C. to about 25° C., or from about 5° C. to about 20° C. The coolant or cooling agent may vaporize at 25° C. at a pressure of from about 0 atm to about 1 atm, from about zero atm to about 0.8 atm, from about zero atm to about 0.5 atm, from about zero atm to about 0.3 atm, or from about zero atm to about 0.1 atm.

The cooling system may further comprise a power source, such as power supply or a battery. The system may be connected directly to the main power grid.

The cooling system may directly absorb heat from at least one heat source by a direct or indirect contact of the cooling interface with the heat source (e.g., electronic device). Utilizing latent heat (i.e. liquid vaporization), the cooling system may cool the heat source. Vaporization may be permitted by applying vacuum to the coolant or cooling agent. The vaporized coolant may be transferred to the condenser to be condensed to form a liquid coolant. The condenser may emit the heat absorbed from the heat source into the environment, to another device, and/or to a heat absorbing material. The liquid coolant may then be directed to the vacuum applied component of the apparatus (e.g., the cooling interface or an expansion container). In an example, the cooling interfaces are in direct contact with the heat source. The heat source may be cooled by placing the cooling interfaces in direct or indirect contact (e.g., through a heat conductor) with the heat source.

The cooling system may be used to cool any type of heat source. For example, the cooling system may be used to cool a server room or farm, central processing unit (CPU), graphics processing unit (GPU), or any other electronic component which generates heat (e.g., a computer or any other electronic device).

The cooling system may include one or more a controllers for controlling the operation of the system. The controller may control flow of the coolant, rate of condensation of the coolant, temperature thresholds for providing coolant, or any combination thereof. The cooling system may comprise one or more orifices or expansion chambers. The orifice or expansion chamber may be in fluid communication with the channels (e.g., the first or second channel). The orifices or expansion chambers may be in fluid communication with the cooling interface. The orifices or expansion chambers may decrease the pressure within the cooling interface. The expansion chamber or container may accumulate liquid coolant prior to providing the liquid coolant to the cooling interface. The cooling system may include one or more splitters that split the fluid flow paths (e.g., coolant and vacuum) between parallel cooling interfaces. The cooling system may include coolant pipes in which the coolant flows. The coolant pipes may be flexible and made of any suitable material, such as plastic, rubber, silicone, polyurethane, or metal.

The cooling system may include power wires or communication wires. The power wires may provide power to the cooling system or heat source. The communication wires may be in communication with the controller and may permit the controller to control the cooling system. The cooling system may include a user interface for displaying the temperature at the cooling interface and/or the surroundings. The user interface may be any screen, such as a computer screen, a tablet or a smart phone, or a screen attached to or associated with the cooling system or the heat source. The cooling system may include one or more thermocouples or temperature sensors. The thermocouples may be in communication with the controller and may permit automatic activation of the cooling system when the temperature reaches an upper or a lower temperature threshold. The upper temperature threshold may be greater than or equal to about 10° C., 15° C., 20° C., 25° C., 30° C., 35° C., 40° C., 45° C., 50° C., 60° C., 70° C., 80° C., 90° C., 100° C., 110° C., 120° C., or greater. The lower temperature threshold may be less than or equal to about 120° C., 110° C., 100° C., 90° C., 80° C., 70° C., 60° C., 50° C., 45° C., 40° C., 35° C., 30° C., 25° C., 20° C., 15° C., 10° C., or less. The thermocouples may be in communication with the controller and may permit automatic activation of the cooling system when the temperature is outside of a temperature range or temperature window. The temperature range or window may be between about 5° C. and 10° C., 5° C. and 20° C., 5° C. and 30° C., 5° C. and 40° C., 5° C. and 50° C., 5° C. and 60° C., 5° C. and 70° C., 5° C. and 90° C., 5° C. and 90° C., 5° C. and 100° C., 5° C. and 110° C., 5° C. and 120° C., 10° C. and 20° C., 10° C. and 30° C., 10° C. and 40° C., 10° C. and 50° C., 10° C. and 60° C., 10° C. and 70° C., 10° C. and 80° C., 10° C. and 90° C., 10° C. and 100° C., 10° C. and 120° C., 20° C. and 30° C., 20° C. and 40° C., 20° C. and 50° C., 20° C. and 60° C., 20° C. and 70° C., 20° C. and 80° C., 20° C. and 90° C., 20° C. and 100° C., 20° C. and 120° C., 30° C. and 40° C., 30° C. and 50° C., 30° C. and 60° C., 30° C. and 70° C., 30° C. and 80° C., 30° C. and 90° C., 30° C. and 100° C., 30° C. and 110° C., 30° C. and 120° C., 40° C. and 50° C., 40° C. and 60° C., 40° C. and 70° C., 40° C. and 80° C., 40° C. and 90° C., 40° C. and 100° C., 40° C. and 110° C., 40° C. and 120° C., 50° C. and 60° C., 50° C. and 70° C., 50° C. and 80° C., 50° C. and 90° C., 50° C. and 100° C., 50° C. and 110° C., 50° C. and 120° C., 60° C. and 70° C., 60° C. and 80° C., 60° C. and 90° C., 60° C. and 100° C., 60° C. and 110° C., 60° C. and 120° C., 70° C. and 80° C., 70° C. and 90° C., 70° C. and 100° C., 70° C. and 110° C., 70° C. and 120° C., 80° C. and 90° C., 80° C. and 100° C., 80° C. and 110° C., 80° C. and 120° C., 90° C. and 100° C., 90° C. and 110° C., 90° C. and 120° C., 100° C. and 110° C., 100° C. and 120° C., or 110° C. and 120° C.

The cooling system may include a transmitter for transmitting date (e.g., temperature or coolant flow rate) to a remote computer or smart phone, either constantly or periodically. The cooling system may include a computer processor and memory. The computer processor and memory may control the cooling system and store data from the cooling system and heat source.

The cooling system may further comprise pump or pumps that may assist in flowing the coolant and/or coolant vapors in the system, as well as a filter or filtration subsystem that allows filtration of the coolant and thus prevent possible clogging of the system.

The cooling system may comprise at least one sensor. The sensor may permit the cooling system to sense that the temperature of either the heat source or the surroundings has exceeded predetermined temperature (e.g., a temperature at which the heat source may be damaged or become inoperable). The sensor may send an alert, turn the cooling system on, or increase the activity of the cooling system by increasing work load, activate additional parallel cooling interfaces, and/or execute an emergency shutdown of the heat source or the entire electronic system comprising the heat source.

The cooling system may comprise a thermostat. The thermostat may permit the cooling system to activate and cool the heat source when the threshold temperature of the heat source or temperature of the surroundings has been reached. Operating the cooling system when the threshold temperature has been reached and not when the threshold temperature has not been reached may increase efficiency of the system and reduce resource use (e.g., power).

The system may be controlled by a control unit or may be self-regulating. Such self-regulation may be employed using an outlet and/or inlet shut-off valve, such as a float valve or pressure relief valve. Such self-regulation may be employed in the absence of a sensor that detects fluid level or fluid volume. The system may further comprise a pressure regulator that regulates the pressure of the cooling interface, condenser, channels, or any combination thereof. The pressure regulator may be in fluid communication with at least one of the first channel, the second channel, the cooling interface, the condenser, the flow generator, or any combination thereof. In an example, the system comprises multiple pressure regulators and each pressure regulator may be in fluid communication with multiple components of the system. The pressure regulate may control the flow rate of the liquid coolant or the vapor coolant.

Methods for Cooling a Heat Source

In another aspect, the present disclosure provides methods for cooling a heat source. The method may include providing a cooling system comprising at least one cooling interface in fluid communication with a first channel, a second channel, and a condenser. The cooling interface may include a coolant inlet, a heat exchange unit, and a coolant outlet. The coolant outlet may comprise an outlet shut-off valve. The cooling system may further comprise an inlet shut-off valve. The method may include directing a liquid coolant from the first channel of the cooling system to the cooling interface using heat from the at least one heat exchange unit to subject the liquid coolant to a phase transition to form a vapor coolant, directing the vapor coolant from the cooling interface through the second channel to the condenser, and subjecting the vapor coolant to a second phase transition to form the liquid coolant. The condensed liquid coolant may be directed back to the first channel. The liquid coolant may accumulate at the cooling interface and may evaporate to form a vapor coolant.

The cooling system may further include a flow generator and the method may include activating the flow generator. The flow generator may be a pump, compressor, educator, or any other device designed to direct fluid flow. The cooling system may include at least 1, 2, 3, 4, 5, or more flow generators. The flow generators may be the same type of flow generator. Alternatively, the system may not include a flow generator. The flow generator may be controlled by a control unit that can activate the flow generator when a temperature threshold is reached or when faster heat removal is required. The flow generator may be activated when a threshold temperature of the heat source or environment surrounding the heat source is reached. The flow generator may permit the system of operate a low pressure (e.g., less than 2 atm). For example, the flow generator may generate a vacuum that directs the flow of the coolant in its liquid form and/or its gaseous form. The flow generator may direct fluid at a volumetric flow rate of greater than or equal to about 0.5 liters per hour (L/h), 1 L/h, 2 L/h, 5 L/h, 10 L/h, 20 L/h, 30 L/h, 40 L/h, 50 L/h, 100 L/h, 200 L/h, 300 L/h, 400 L/h, 500 L/h, 1,000 L/h, 2,000 L/h, 3,000 L/h, 4,000 L/h, 5,000 L/h, 10,000 L/h, 20,000 L/h, 30,000 L/h, 40,000 L/h, or greater. The flow generator may direct fluid at a volumetric flow rate of less than or equal to about 40,000 L/h, 30,000 L/h, 20,000 L/h, 10,000 L/h, 5,000 L/h, 4,000 L/h, 3,000 L/h, 2,000 L/h, 1,000 L/h, 500 L/h, 400 L/h, 300 L/h, 200 L/h, 100 L/h, 50 L/h, 40 L/h, 30 L/h, 20 L/h, 10 L/h, 5 L/h, 2 L/h, 1 L/h, 0.5 L/h, or less. The method may comprise activating a flow generator to flow the coolant within the system.

The activation of the cooling system may be automatic (e.g., self-regulating) when a threshold temperature is reached or may be controlled by a controller. The temperature of the cooling system and heat source may be monitored or the temperatures may not be monitored. The coolant flow rate of the system may increase or decrease as the temperature of the heat sources increases and decreases, respectively. The coolant flow rate may be self-regulated or controlled by the flow generator.

The method may include monitoring the temperature of the heat source, the environment surrounding the heat source, or the cooling interface. The temperature may be monitored by one or more thermocouples. The thermocouples may be in communication with the controller and may permit automatic activation of the cooling system when the temperature reaches an upper temperature threshold. The upper temperature threshold may be greater than or equal to about 10° C., 15° C., 20° C., 25° C., 30° C., 35° C., 40° C., 45° C., 50° C., 60° C., 70° C., 80° C., 90° C., 100° C., 110° C., 120° C., or greater. The thermocouple may signal the controller to stop directing coolant away from the cooling interface when the temperature is below a lower limit of the temperature window or range. The lower limit of the temperature window or range may be less than or equal to 120° C., 110° C., 100° C., 90° C., 80° C., 70° C., 60° C., 50° C., 45° C., 40° C., 35° C., 30° C., 25° C., 20° C., 15° C., 10° C., or less. The thermocouples may be in communication with the controller and may permit automatic activation of the cooling system when the temperature is outside of a temperature range or temperature window. The temperature range or window may be between about 5° C. and 10° C., 5° C. and 20° C., 5° C. and 30° C., 5° C. and 40° C., 5° C. and 50° C., 5° C. and 60° C., 5° C. and 70° C., 5° C. and 90° C., 5° C. and 90° C., 5° C. and 100° C., 5° C. and 110° C., 5° C. and 120° C., 10° C. and 20° C., 10° C. and 30° C., 10° C. and 40° C., 10° C. and 50° C., 10° C. and 60° C., 10° C. and 70° C., 10° C. and 80° C., 10° C. and 90° C., 10° C. and 100° C., 10° C. and 120° C., 20° C. and 30° C., 20° C. and 40° C., 20° C. and 50° C., 20° C. and 60° C., 20° C. and 70° C., 20° C. and 80° C., 20° C. and 90° C., 20° C. and 100° C., 20° C. and 120° C., 30° C. and 40° C., 30° C. and 50° C., 30° C. and 60° C., 30° C. and 70° C., 30° C. and 80° C., 30° C. and 90° C., 30° C. and 100° C., 30° C. and 110° C., 30° C. and 120° C., 40° C. and 50° C., 40° C. and 60° C., 40° C. and 70° C., 40° C. and 80° C., 40° C. and 90° C., 40° C. and 100° C., 40° C. and 110° C., 40° C. and 120° C., 50° C. and 60° C., 50° C. and 70° C., 50° C. and 80° C., 50° C. and 90° C., 50° C. and 100° C., 50° C. and 110° C., 50° C. and 120° C., 60° C. and 70° C., 60° C. and 80° C., 60° C. and 90° C., 60° C. and 100° C., 60° C. and 110° C., 60° C. and 120° C., 70° C. and 80° C., 70° C. and 90° C., 70° C. and 100° C., 70° C. and 110° C., 70° C. and 120° C., 80° C. and 90° C., 80° C. and 100° C., 80° C. and 110° C., 80° C. and 120° C., 90° C. and 100° C., 90° C. and 110° C., 90° C. and 120° C., 100° C. and 110° C., 100° C. and 120° C., or 110° C. and 120° C. In an example, the temperature window may be between.

The system may include a single controller or multiple controllers. For example, each component of the system (e.g., condenser, inlet shut-off valve, outlet shut-off valve, etc.) may each be in communication with a single controller or a single controller may control more than one components of the system. In an example, a controller may control the inlet shut-off valve and the outlet shut-off valve. The controller may control each of the shut-off valves individually (e.g., the open/closed state of one valve does not affect the other) or simultaneously (e.g., the open/closed state of one valve is used to determine or affect the open/closed state of the other valve).

The method may be used to cool any type of heat source. For example, the cooling system may be used to cool a server room or farm, central processing unit (CPU), graphics processing unit (GPU), or any other electronic component which generates heat (e.g., a computer or any other electronic device).

The method may change or maintain the temperature of heat source and/or the surroundings to a temperature of about 25° C. The temperature of the heat source of the surrounding environment may be maintained in a range from about −20° C. to about 25° C., from about −15° C. to about 20° C., from about −10° C. to about 20° C., from about −5° C. to about 20° C., from about 0° C. to about 20° C., from about 0° C. to about 15° C., from about −5° C. to about 15° C., from about −5° C. to about 10° C., or from about −5° C. to about 5° C. In an example, the method may maintain the temperature of a heat source, such as electronic components (e.g., a server room, a CPU and/or a GPU), at a temperature of from about 40° C. to about 50° C.

The cooling interfaces may be in direct or indirect contact with the heat source. The heat source may be cooled by placing the cooling interfaces in direct or indirect contact (e.g., through a heat conductor) with the heat source.

The outlet and/or inlet shut-off valve may be a mechanical or electric valve. The outlet and/or inlet shut-off valve may be controlled by a control unit or may be physically controlled (e.g., by liquid coolant level). The outlet and/or inlet shut-off valve may be self-regulating. In an example, the system comprises an outlet shut-off valve and the outlet shut-off valve is a pressure relief valve that maintains the pressure of the cooling interface within a range, thereby maintaining the amount of coolant within the interface. In another example, the system further comprises an inlet shut-off valve that is a float valve designed to prevent liquid coolant from entering the associated cooling interface when the liquid coolant within the cooling interface unit reaches a predefined level/amount. For example, when the liquid level is below a threshold volume or level, the float valve may be in an open position and allow liquid coolant to flow into the cooling interface. When the liquid level reaches the threshold volume or level the float valve may be in a closed interface and prevent liquid coolant from flowing into the cooling interface. Using a pressure relief valve and/or a float valve may reduce the use of a flow generator to continuously flow the coolant through the cooling system which may reduce maintenance costs and redundant flow generators.

Each outlet and/or inlet shut-off valve may be in fluid communication with a single cooling interface. Alternatively, or in addition to, each outlet and/or inlet shut-off valve may in fluid communication with more than one cooling interface. An outlet and/or inlet shut-off valve may be in fluid communication with at least 2, 3, 4, 5, 6, 7, 8, 9, 10, or more cooling interfaces. The outlet and/or shut-off valves may be controlled as a group or may be individually controlled to permit fluid to enter the cooling interfaces. For example, outlet shut-off valves may be individually addressable.

The cooling system may have a single cooling interface or multiple cooling interfaces. The cooling system may have at least 2, 3, 4, 6, 8, 10, 20, 40, 60, 80, 100, or more cooling interfaces. The cooling system may include cooling interfaces connected in a parallel or series configuration. The cooling system may include at least one line or set of 2, 3, 4, 5, 6, 7, 8, 9, 10 or more cooling interface connected in a series configuration. Alternatively, or in addition to, the cooling system may have at least one line or set of 2, 3, 4, 5, 6, 7, 8, 9, 10 or more cooling interface connected in parallel. In an example, the cooling system comprises at least one line or set of 2, 3, 4, 5, 6, 7, 8, 9, 10 or more cooling interface connected both in series and in parallel. The cooling interfaces of the system may be grouped such that a single outlet and/or inlet shut-off valve controls the flow of liquid coolant to the group of cooling interfaces. The cooling system may have multiple groups of cooling interfaces, each in fluid communication with a single outlet and/or inlet shut-off valve. A group of cooling interfaces may include at least 2, 3, 4, 5, 6, 7, 8, 9, 10, or more cooling interfaces. A cooling system may include at least 2, 3, 4, 5, 6, 7, 8, 9, 10, 20, 30, 40, 50, or more groups of cooling interfaces.

The cooling system may be provided empty (e.g., without any coolant) and the method may include adding coolant to the system after installation of the cooling system. The coolant may include alcohol, water, glycol, a salt solution, or any combination thereof. The coolant or cooling agent may vaporize at less than or equal to about 1 atm at a low temperature. The coolant may vaporize at a pressure of less than or equal to about 1 atm and a temperature between about 0° C. to about 40° C., about 0° C. to about 30° C., about 0° C. to about 20° C., about 0° C. to about 10° C., about 5° C. to about 25° C., about 10° C. to about 25° C., about 15° C. to about 25° C., or from about 5° C. to about 20° C. The coolant or cooling agent may vaporize at 25° C. at a pressure of from about 0 atm to about 1 atm, from about zero atm to about 0.8 atm, from about zero atm to about 0.5 atm, from about zero atm to about 0.3 atm, or from about zero atm to about 0.1 atm.

The amount of heat dissipated by the system may be dependent upon the coolant used, the flow rate of the coolant, the area of the heat exchange unit, and the temperature differential between the coolant and the heat source. The cooling system may dissipate greater than or equal to about 50 watts per square centimeter ($W/cm^2$), 75 $W/cm^2$, 100 $W/cm^2$, 125 $W/cm^2$, 150 $W/cm^2$, 200 $W/cm^2$, 250 $W/cm^2$, 300 $W/cm^2$, 400 $W/cm^2$, 500 $W/cm^2$, or more. The temperature differential between the heat source and the coolant may be greater than or equal to about 1° C., 3° C., 5° C., 7° C., 10° C., 15° C., 20° C., 30° C., 40° C., 50° C., or more. The temperature differential between the heat source and the coolant may be less than or equal to about 50° C., 40° C., 30° C., 20° C., 15° C., 10° C., 7° C., 5° C., 3° C., 1° C., or less.

Computer Control Systems

Figure 6:
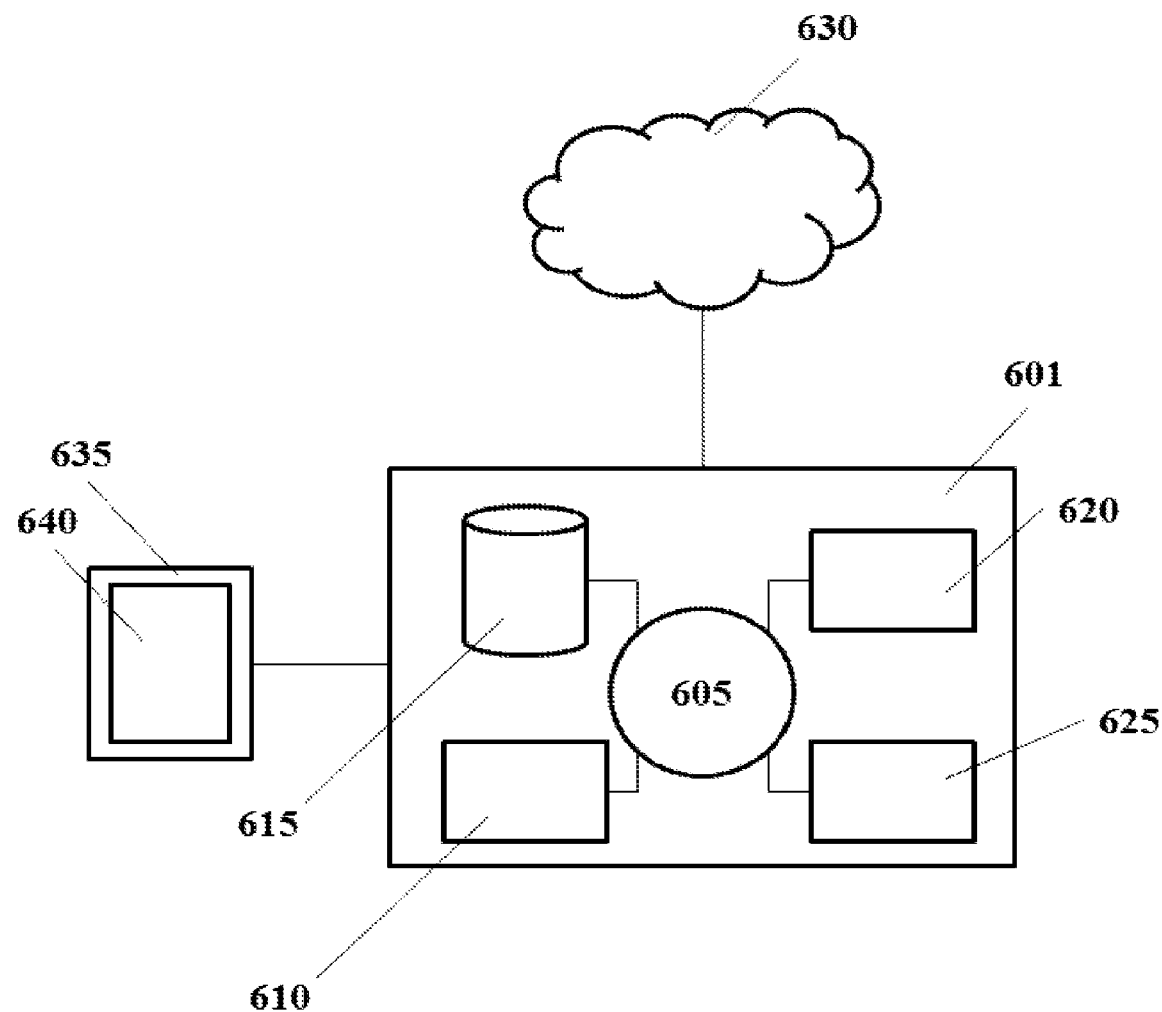
FIG. 6 shows a computer control system that is programmed or otherwise configured to implement methods provided herein.

The present disclosure provides computer control systems that are programmed to implement methods of the disclosure. FIG. 6 shows a computer system 601 that is programmed or otherwise configured to monitor and control temperature. The computer system 601 can regulate various aspects of methods and systems of the present disclosure, such as, for example, controlling the flow of coolant through a cooling system to regulate temperature. The computer system 601 can be an electronic device of a user or a computer system that is remotely located with respect to the electronic device. The electronic device can be a mobile electronic device.

The computer system 601 includes a central processing unit (CPU, also "processor" and "computer processor" herein) 605, which can be a single core or multi core processor, or a plurality of processors for parallel processing. The computer system 601 also includes memory or memory location 610 (e.g., random-access memory, read-only memory, flash memory), electronic storage unit 615 (e.g., hard disk), communication interface 620 (e.g., network adapter) for communicating with one or more other systems, and peripheral devices 625, such as cache, other memory, data storage and/or electronic display adapters. The memory 610, storage unit 615, interface 620 and peripheral devices 625 are in communication with the CPU 605 through a communication bus (solid lines), such as a motherboard. The storage unit 615 can be a data storage unit (or data repository) for storing data. The computer system 601 can be operatively coupled to a computer network ("network") 630 with the aid of the communication interface 620. The network 630 can be the Internet, an internet and/or extranet, or an intranet and/or extranet that is in communication with the Internet. The network 630 in some cases is a telecommunication and/or data network. The network 630 can include one or more computer servers, which can enable distributed computing, such as cloud computing. The network 630, in some cases with the aid of the computer system 601, can implement a peer-to-peer network, which may enable devices coupled to the computer system 601 to behave as a client or a server.

The CPU 605 can execute a sequence of machine-readable instructions, which can be embodied in a program or software. The instructions may be stored in a memory location, such as the memory 610. The instructions can be directed to the CPU 605, which can subsequently program or otherwise configure the CPU 605 to implement methods of the present disclosure. Examples of operations performed by the CPU 605 can include fetch, decode, execute, and writeback.

The CPU 605 can be part of a circuit, such as an integrated circuit. One or more other components of the system 601 can be included in the circuit. In some cases, the circuit is an application specific integrated circuit (ASIC).

The storage unit 615 can store files, such as drivers, libraries and saved programs. The storage unit 615 can store user data, e.g., user preferences and user programs. The computer system 601 in some cases can include one or more additional data storage units that are external to the computer system 601, such as located on a remote server that is in communication with the computer system 601 through an intranet or the Internet.

The computer system 601 can communicate with one or more remote computer systems through the network 630. For instance, the computer system 601 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 601 via the network 630.

Methods as described herein can be implemented by way of machine (e.g., computer processor) executable code stored on an electronic storage location of the computer system 601, such as, for example, on the memory 610 or electronic storage unit 615. The machine executable or machine readable code can be provided in the form of software. During use, the code can be executed by the processor 605. In some cases, the code can be retrieved from the storage unit 615 and stored on the memory 610 for ready access by the processor 605. In some situations, the electronic storage unit 615 can be precluded, and machine-executable instructions are stored on memory 610.

The code can be pre-compiled and configured for use with a machine having a processer adapted to execute the code, or can be compiled during runtime. The code can be supplied in a programming language that can be selected to enable the code to execute in a pre-compiled or as-compiled fashion.

Aspects of the systems and methods provided herein, such as the computer system 601, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 601 can include or be in communication with an electronic display 635 that comprises a user interface (UI) 640 for providing, for example, system and temperature information. Examples of UI's include, without limitation, a graphical user interface (GUI) and web-based user interface.

Methods and systems of the present disclosure can be implemented by way of one or more algorithms. An algorithm can be implemented by way of software upon execution by the central processing unit 605. The algorithm can, for example, regulate systems or implement methods provided herein.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention.

Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A cooling system, comprising:
a first channel that is configured to direct a liquid coolant;
a second channel that is configured to direct a vapor coolant generated from said liquid coolant;
a condenser that is configured to permit said vapor coolant to undergo phase transition to said liquid coolant; and
at least one cooling interface in fluid communication with said first channel and said second channel, wherein said at least one cooling interface comprises (i) a coolant inlet for directing said liquid coolant from said first channel towards said second channel; (ii) at least one heat exchange unit for permitting heat to flow from a source of thermal energy to said liquid coolant from said coolant inlet, thereby permitting said liquid coolant to undergo phase transition to said vapor coolant; and (iii) a coolant outlet comprising an outlet shut-off valve to permit said vapor coolant to controllably flow from said at least one heat exchange unit to said second channel, wherein the outlet shut-off valve is located between the coolant outlet of the at least one cooling interface and the condenser, and is configured to meter the flow of the vapor coolant exiting the at least one cooling interface to thereby increase pressure within the at least one cooling interface to increase a boiling point of the liquid coolant.

2. The cooling system of claim 1, further comprising a flow generator in fluid communication with said first channel or said second channel.

3. The cooling system of claim 1, wherein said system is operated at a pressure of less than about 1 atmosphere.

4. The cooling system of claim 1, wherein said outlet shut-off valve is an electric or mechanical valve.

5. The cooling system of claim 1, wherein said system is self-regulating.

6. The cooling system of claim 2, further comprising a control unit in communication with said outlet shut-off valve, condenser, flow generator, or any combination thereof.

7. The cooling system of claim 1, wherein the outlet shut-off valve is configured to operate as a pressure regulator in fluid communication with said first channel, second channel, condenser, at least one cooling interface, or any combination thereof.

8. The cooling system of claim 7, wherein said pressure regulator controls a flow rate of said liquid coolant and/or said vapor coolant.

9. The cooling system of claim 1, wherein said at least one cooling interface comprises two or more individual cooling interfaces.

10. The cooling system of claim 1, wherein said at least one cooling interface comprises two or more cooling interfaces, and wherein said two or more cooling interfaces are connected in series.

11. The cooling system of claim 1, wherein said at least one cooling interface comprises two or more cooling interfaces, and wherein said two or more cooling interfaces are connected in parallel.

12. The cooling system of claim 1, wherein said cooling interface has a surface area of less than about 25 square centimeters.

13. The cooling system of claim 1, wherein said at least one cooling interface is in direct contact with said source of thermal energy.

14. The cooling system of claim 1, wherein said at least one cooling interface is in indirect contact with said source of thermal energy.

15. The cooling system of claim 1, further comprising an orifice in fluid communication with said first channel or said second channel.

16. The cooling system of claim 15, wherein said orifice aids with creating a vacuum within said at least one cooling interface.

17. The cooling system of claim 1, wherein said system provides on demand cooling to said source of thermal energy by controlling an amount of coolant in said at least one cooling interface.

18. A method for controlling a temperature of a source of thermal energy, comprising:

a. providing a cooling system comprising at least one cooling interface in fluid communication with a first channel, a second channel, and a condenser, wherein said at least one cooling interface comprises a coolant inlet, at least one heat exchange unit, and a coolant outlet comprising an outlet shut-off valve located between the coolant outlet of the at least one cooling interface and the condenser;

b. directing a liquid coolant from said first channel to said at least one cooling interface;

c. in said at least one cooling interface, using thermal energy from said at least one heat exchange unit to subject said liquid coolant to a first phase transition to form a vapor coolant;

d. using the outlet shut-off valve to meter a flow of the vapor coolant exiting the at least one cooling interface to thereby increase pressure within the at least one cooling interface to increase a boiling point of the liquid coolant;

e. directing said vapor coolant from said at least one cooling interface through said second channel to said condenser; and f. subjecting said vapor coolant to a second phase transition to form said liquid coolant.

* * * * *